United States Patent [19]
Okada et al.

[11] Patent Number: 5,946,279
[45] Date of Patent: Aug. 31, 1999

[54] SERVO CIRCUIT, DIGITAL PLL CIRCUIT AND OPTICAL DISK DEVICE

[75] Inventors: Isao Okada; Tsuyoshi Hirabuki, both of Chofu, Japan

[73] Assignee: Mitsumi Electric Co., Ltd., Tokyo, Japan

[21] Appl. No.: 08/839,015

[22] Filed: Apr. 23, 1997

[30] Foreign Application Priority Data

| Apr. 30, 1996 | [JP] | Japan | 8-109654 |
| Apr. 30, 1996 | [JP] | Japan | 8-109655 |
| Apr. 30, 1996 | [JP] | Japan | 8-109656 |
| Feb. 28, 1997 | [JP] | Japan | 9-046010 |

[51] Int. Cl.$^6$ .................................................. G11B 7/00
[52] U.S. Cl. .............................................. 369/50; 369/47
[58] Field of Search .............................. 369/50, 47, 48, 369/59; 360/73.03, 51

[56] References Cited

U.S. PATENT DOCUMENTS

| 5,170,386 | 12/1992 | Tateishi . | |
| 5,521,895 | 5/1996 | Miura et al. | 369/50 |
| 5,528,574 | 6/1996 | Takeuchi et al. | 369/50 |
| 5,535,183 | 7/1996 | Miura et al. | 369/50 |
| 5,694,380 | 12/1997 | Shimizume et al. | 369/50 |
| 5,703,851 | 12/1997 | Ando | 369/50 |

FOREIGN PATENT DOCUMENTS

| 344994 | 12/1989 | European Pat. Off. . |
| 414557 | 2/1991 | European Pat. Off. . |
| 570834 | 11/1993 | European Pat. Off. . |
| 5-225580 | 9/1993 | Japan . |

*Primary Examiner*—Thang V. Tran
*Attorney, Agent, or Firm*—Andrus, Sceales, Starke & Sawall

[57] ABSTRACT

A speed error detecting portion detects a speed error which is a frequency difference between a reproduced clock signal which is reproduced from a recording medium and a reference clock signal. A first phase error detecting portion detects a phase error which is a phase difference between the reproduced clock signal and the reference clock signal. A servo signal generating portion generates a servo signal which is used for eliminating the speed error and phase error. A second phase error detecting portion detects a phase error which is a phase difference between a reproduced synchronization signal reproduced from the recording medium separately from the reproduced clock signal and a reference synchronization signal. A reference phase changing portion changes the phase of the reference clock signal based on the phase error detected by the second phase error detecting portion. A reference frequency changing portion changes the frequency of the reference clock signal based on the phase error detected by the second phase error detecting portion.

11 Claims, 15 Drawing Sheets

Tref

PLLCLK

FIG. 11A REF 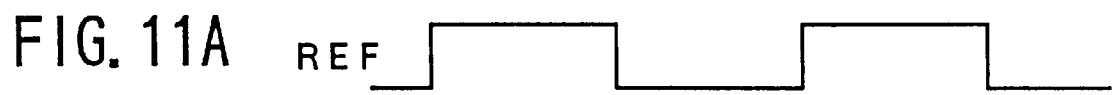
FIG. 11B DBCK 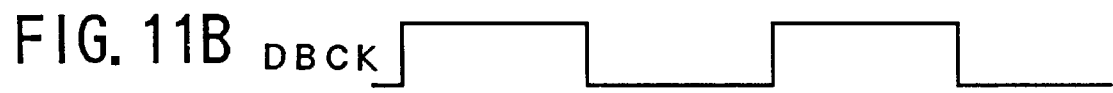
FIG. 11C PHASE DATA 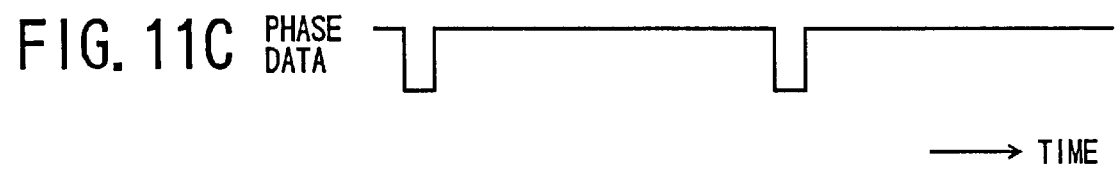
→ TIME
FIG. 12A REF 
FIG. 12B DBCK 
FIG. 12C PHASE DATA 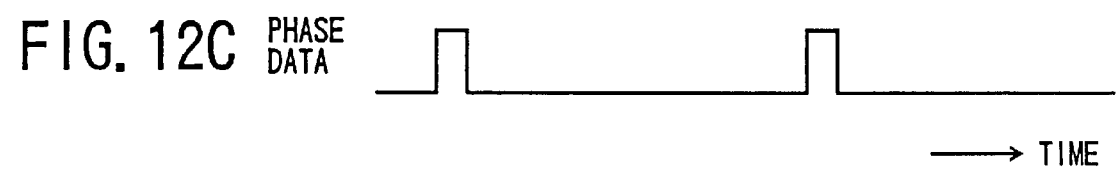
→ TIME

SERVO CIRCUIT, DIGITAL PLL CIRCUIT AND OPTICAL DISK DEVICE

BACKGROUND OF THE INVENTION

1. Field of the Invention

The present invention relates to a servo circuit, in particular, to a servo circuit having a speed control system and two phase control systems.

The present invention also relates to a digital PLL circuit, in particular, to a digital PLL circuit which generates a clock signal which is in synchronization with pulses of predetermined pulse widths included in an input signal.

The present invention also relates to an optical disk device, in particular, to an optical disk device which performs recording data on a recordable optical disk and reproducing data therefrom.

2. Description of the Related Art

FIG. 1 shows a block diagram of an example of a servo circuit in the related art. In the figure, a speed detected value and a phase detected value are input to terminals 10 and 11, respectively. An adder 12 subtracts a speed reference value from the speed detected value, and thus, a speed error value is obtained. A multiplier 13 multiplies the speed error value by a coefficient $K_1$, and then, the product of the multiplication is supplied to an adder 14. An adder 15 subtracts a phase reference value from the phase detected value, and thus, a phase error value is obtained. A multiplier 16 multiplies the phase error value by a coefficient $K_2$, and then, the product of the multiplication is supplied to the adder 14. The adder 14 adds the value supplied from the multiplier 13 to the value supplied from the multiplier 16. Thus, the adder 14 generates a servo error value and outputs it via a terminal 17.

FIG. 2 shows a block diagram of an example of an analog PLL (Phase-Locked Loop) circuit in the related art. In the figure, to a terminal 2010, an input signal including a predetermined frequency component is input, and is supplied to a phase comparator 2011. The phase comparator 2011 compares the phase of the input signal with the phase of a signal of a predetermined frequency supplied from a frequency divider 2014, and thus, generates a phase error signal. The phase error signal is supplied to a VCO (Voltage-Controlled Oscillator) 2013 through a LPF (Low-Pass Filter) 2012. The frequency divider 2014 performs frequency dividing on an oscillated signal outputted from the VCO 2013, and thus, the frequency of the oscillated signal becomes a predetermined frequency. The signal of the predetermined frequency is output via a terminal 2015 and also is supplied to the phase comparator 2011. Thereby, the VCO 2013 generates the oscillated signal which is in synchronization with the predetermined frequency component of the input signal. The frequency divider 2014 performs frequency dividing on the oscillated signal, and the resulting signal is output via the terminal 2015.

Only a synchronization signal for disk rotation control and a control signal such as an address signal are previously recorded in a recordable optical disk. As a method therefor, there is a method, as mentioned in the Orange Book which is a standard of a recordable compact disk system (CD-R), in which a groove is formed to meander, and thus, a synchronization signal is recorded on a disk. A signal recorded on a disk in such a way by causing a groove to meander is referred to as a wobble signal.

The wobble signal is a signal obtained from performing FSK modulation using a bi-phase modulation signal BIDATA which is information such as a disk address and so forth. When disk rotation is of a regular line velocity, the frequency of the wobble signal is 22.05±1 kHz. An ATIP signal, which is the above-mentioned information such as an address and so forth, includes a synchronization signal ($ATIP_{syc}$), an address and an error-detecting code CRC. The repeating frequency of the synchronization signal is 75 Hz.

FIG. 3A shows a BIDATA signal obtained from performing FSK demodulation on a wobble signal reproduced from a disk. By supplying the BIDATA signal to the PLL circuit shown in FIG. 2, a clock signal such as that shown in FIG. 3B is generated. In the BIDATA signal, as shown in FIG. 3A, repetition of a pulse width 1T and a pulse width 2T is an address and CRC pattern. A synchronization signal pattern is, in order to distinguish it from the address and CRC pattern, a pattern of pulse widths 3T, 1T, 1T and 3T. In the specification of the present application, a 'pulse width' means a duration of each of a high level period and a low level period of a pulse.

When data is recorded in the above-mentioned CD-R, speed control and phase control are performed so that the clock signal generated from the BIDATA signal is in synchronization with a reference clock signal. Further, it is also necessary that the phase of a synchronization signal (repeating frequency: 75 Hz) included in recording data is made to be in synchronization with the phase of the synchronization signal ($ATIP_{syc}$) of the ATIP signal reproduced from the disk.

It can be assumed that: a phase error value between the synchronization signal ($ATIP_{syc}$) of the ATIP signal and the synchronization signal (SBSY: sub-code sync) of the recording data is obtained; the speed detected value and the phase detected value of the clock signal generated from the BIDATA signal are supplied to the terminals 10 and 11 shown in FIG. 1, respectively; and the above-mentioned phase error value of the synchronization signals is multiplied by a predetermined coefficient and then the product is supplied also to the adder 14 shown in FIG. 1. In such a case, there may occur a case where the phase error value of the clock signal is a positive value and the phase error value of the synchronization signals is a negative value. Therefore, a proper servo operation may not be performed. Such a problem will be referred to as a first problem.

The phase comparator 2011 shown in FIG. 2 compares pulse edges of the BIDATA signal shown in FIG. 3A with pulse edges of the clock signal shown in FIG. 3B. Therefore, the 75 Hz component of the synchronization signal pattern is mixed in the phase error signal, and cannot be removed through the LPF 2012. Thereby, stability of the clock signal is degraded. Such a problem will be referred to as a second problem.

As mentioned above, there is a recordable compact disk system (CD-R) as a system for a recordable disk. In the CD-R, synchronization information for rotation control and address information is recorded as a wobble signal as a result of forming a groove to meander.

As mentioned above, the wobble signal is a signal obtained from performing FSK modulation using a bi-phase modulation signal BIDATA which is information such as a disk address and so forth. When disk rotation is of a regular line velocity, the frequency of the wobble signal is 22.05±1 kHz. An ATIP signal, which is the above-mentioned information such as an address and so forth, includes a synchronization signal ($ATIP_{syc}$), an address and an error-detecting code CRC. The repeating frequency of the synchronization signal is 75 Hz.

For example, Japanese Laid-Open Patent Application No. 5-225580 discloses an optical disk device which performs recording data on such an optical disk and reproducing data therefrom.

In such an optical disk device, a reproduced signal reproduced through an optical head from an optical disk undergoes signal processing using an analog circuit. Thus, optical disk rotation control is performed.

A circuit shown in FIG. 4 is an example of a demodulation circuit which performs FSK demodulation on a wobble signal and thus obtains a BIDATA signal which is a modulation signal.

In the circuit shown in FIG. 4, a wobble signal input to a terminal 3010 is supplied to a phase comparator 3012. The phase comparator 3012 compares the phase of the input wobble signal with the phase of an output signal of a VCO (Voltage-Controlled Oscillator) 3014. Thus, a phase error signal is obtained. The phase error signal is supplied to a low-pass filter 3016 and unnecessary high-frequency components are removed. Thus, an FSK demodulated signal is obtained and is output via a terminal 3020. The FSK demodulated signal is also supplied to a multiplier 3022. The multiplier 3022 multiplies the FSK demodulated signal by a loop gain K. The resulting signal is supplied to the VCO 3014.

When the transfer function of the low-pass filter 3016 is assumed to be $F(S)=1+\omega_p/S$ (where $\omega_p$ is the cutoff frequency), the FSK demodulation characteristic depends on $\omega_p$. When the operation speed varies from a single speed, to a double speed, and then to a four-times speed, the frequency of the wobble signal varies from 22.05±1 kHz, to 44.1±2 kHz and then to 88.2±4 kHz. Therefore, in the circuit shown in FIG. 4, the cutoff frequency of the low-pass filter 3016 should be changed when the operation speed is changed. Further, other than this matter, it is necessary to make the circuit parameters be the optimum ones for stabilizing the loop. Such a problem will be referred to as a third problem.

Further, when such the entirety of an analog circuit is formed to be a semiconductor integrated circuit, it is difficult to set the circuit parameters with high accuracy. Therefore, it is necessary to externally connect circuit elements, the circuit parameters of which should be set with high accuracy. Thus, forming the entirety of such a circuit to be an integrated circuit is difficult. Such a problem will be referred to as a fourth problem.

SUMMARY OF THE INVENTION

The present invention is devised in consideration of the above-mentioned first problem. An object of the present invention is to provide a servo circuit which can simultaneously perform phase control of two controlled systems when these two controlled systems concern the phase of a signal reproduced from a recording medium.

As shown in FIG. 5A, a first aspect of the present invention comprises:

speed error detecting means M1 for detecting a speed error which is a frequency difference between a reproduced clock signal which is reproduced from a recording medium and a reference clock signal;

first phase error detecting means M2 for detecting a phase error which is a phase difference between the reproduced clock signal and the reference clock signal;

servo signal generating means M3 for generating a servo signal which is used for eliminating the speed error and phase error;

second phase error detecting means M4 for detecting a phase error which is a phase difference between a reproduced synchronization signal reproduced from the recording medium separately from the reproduced clock signal and a reference synchronization signal; and reference phase changing means M5 for changing the phase of the reference clock signal based on the phase error detected by the second phase error detecting means.

Thus, the phase of the reference clock signal, which is used for detecting the phase error of the reproduced clock signal, is changed based on the phase error of the reproduced synchronization signal reproduced from the recording medium. Thereby, there is only one phase system servo loop, and the servo signal is generated from adding the phase error of the reproduced clock signal and the phase error of the reproduced synchronization signal. Thereby, it is possible to correct the phase errors of the two systems at the same time.

As shown in FIG. 5B, another aspect of the present invention, according to the above-described servo circuit, further comprises reference frequency changing means M6 for changing the frequency of the reference clock signal based on the phase error detected by the second phase error detecting means.

By changing the frequency of the reference clock signal based on the phase error of the reproduced synchronization signal, the time required for correcting the phase error of the reproduced synchronization signal can be reduced. Thus, the stabilized reproduced clock signal and reproduced synchronization signal can be reproduced earlier.

The present invention is devised further in consideration of the above-mentioned second problem. Thus, another object of the present invention is to provide a digital PLL circuit which prevents mixing of a low-frequency component included in an input signal into an output clock signal, and improves the stability of the clock signal.

Another aspect of the present invention comprises:

measuring means for receiving an input signal which intermittently includes pulses of a predetermined pulse width and measuring edge spans of the input signal; and clock generating means, when an edge span value obtained by the measuring means is within a predetermined range which is based on the predetermined pulse width, for generating a clock signal based on the edge span value.

Thereby, pulses, which are of edge span values out of the predetermined range which is based on the predetermined pulse width, do not contribute to generating the clock signal. Therefore, if the repeating frequency of the pulses out of the predetermined range is a low frequency, the mixing of the low frequency into the clock signal can be prevented.

Another aspect of the present invention, according to the above-described digital PLL circuit, further comprises phase correcting means for detecting a phase error from a measurement value of the measuring means, the measurement value being obtained in a timing of the clock signal which is generated by the clock generating means, the phase correcting means operating so that the edge span value measured by the measuring means is corrected.

Thereby, not only the frequency of the clock signal comes to be equal to the frequency based on the edge spans of the pulses of the predetermined pulse width included in the input signal, but also the phase of the clock signal comes to be in synchronization with the phase of these pulses. Thereby, the stability of the clock signal is improved.

The present invention is devised further in consideration of the above-mentioned third and fourth problems. Thus, another object of the present invention is to provide an optical disk device which can be formed of a digital circuit and can be formed into a semiconductor integrated circuit, and is easily adaptable for different operation speeds.

Another aspect of the present invention comprises:

a digital demodulation circuit for receiving a signal which is obtained as a result of reproducing from an optical disk, on which a digital modulated signal is previously recorded, and converting into a two-level signal, the digital demodulation circuit performing digital demodulation on the received signal;

a digital phase-locked loop circuit for generating a clock signal which is in phase synchronization with a demodulated signal output by the digital demodulation circuit; and a digital servo circuit for performing rotation control of the optical disk so as to correct a frequency error and a phase error between the clock signal and a reference clock signal.

Thus, each of the demodulation circuit, phase-locked loop circuit and servo circuit is formed to be a digital circuit. Thereby, it is easy to form the circuits into a semiconductor integrated circuit.

In another aspect of the present invention, according to the above-described optical disk, the digital demodulation circuit, the digital phase-locked loop circuit and the digital servo circuit are formed to be an integrated circuit on a single semiconductor chip.

By forming the all the circuits as an integrated circuit on a single semiconductor chip, the device can be miniaturized.

In another aspect of the present invention, according to the above-described optical disk, the digital demodulation circuit measures edge spans of the received two-level signal using system clock pulses, the frequency of which is changed according to an operation speed, and outputs a demodulated signal based on measured values.

As a result of measuring edge spans of the two-level signal using the system clock pulses, it is easy to adapt the device for different operation speeds, by changing the frequency of the system clock pulses according to the operation speeds.

Other objects and further features of the present invention will become more apparent from the following detailed description when read in conjunction with the accompanying drawings.

BRIEF DESCRIPTION OF THE DRAWINGS

FIGS. 11A, 11B and 11C show signal waveforms for illustrating the present invention;

FIGS. 12A, 12B and 12C show signal waveforms for illustrating the present invention;

DETAILED DESCRIPTION OF PREFERRED EMBODIMENTS

Figure 6:
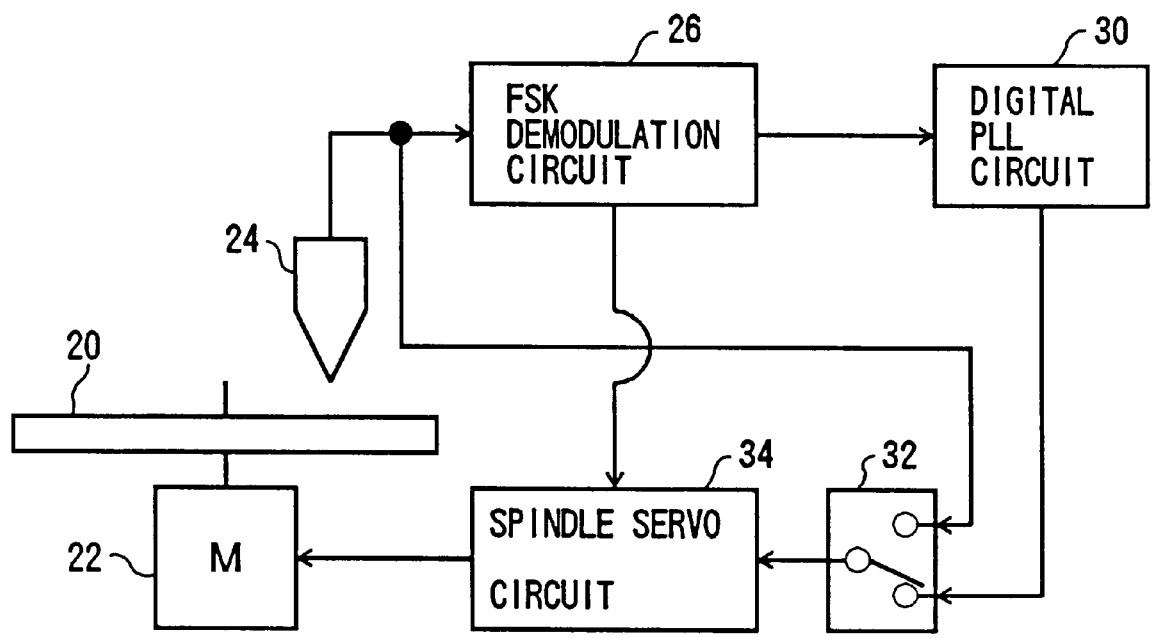
FIG. 6 shows a block diagram of an example of an optical disk device (CD-R recording servo system), to which each of the spindle servo circuit in the first embodiment of the present invention and a spindle servo circuit in a second embodiment of the present invention can be applied.

FIG. 6 shows a block diagram of an example of a CD-R recording servo system, to which each of a servo circuit in a first embodiment of the present invention and a servo circuit in a second embodiment of the present invention, which will be described later, can be applied. In the figure, an optical disk 20 (recording medium) is rotated by a spindle motor 22. An optical pickup 24 reproduces a wobble signal shown in FIG. 7B from the disk 20, and outputs a WBL signal shown in FIG. 7C. The WBL signal shown in FIG. 7C is obtained from converting the wobble signal shown in FIG. 7B into a two-level signal.

Figures 7A, 7B, 7C:
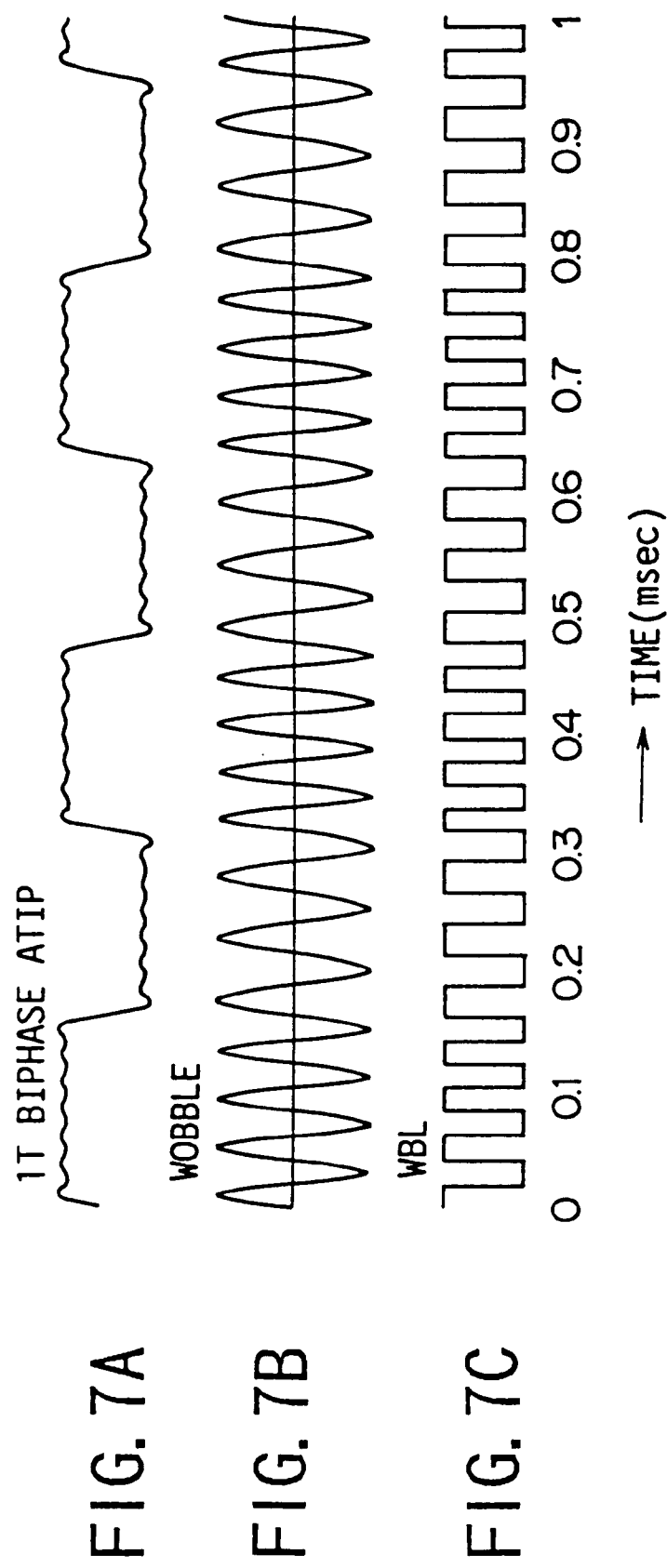
FIGS. 7A, 7B and 7C show signal waveforms for illustrating the present invention.

The WBL signal is supplied to an FSK demodulation circuit 26, and a BIDATA signal shown in FIG. 7A is obtained from the demodulation. Further, a synchronization signal ($ATIP_{syc}$) is detected. The BIDATA signal is supplied to a digital PLL circuit 30. The digital PLL circuit 30 generates a clock signal which is in synchronization with the BIDATA signal and supplies the clock signal to a switch 32. The switch 32 selects the reproduced WBL signal when rotation of the disk 20 is started. When the rotation of the disk 20 is stabilized, the switch 32 selects the clock signal, output by the digital PLL circuit 30, and supplies the selected signal to a spindle servo circuit 34. The spindle servo circuit 34, based on the signal obtained from performing 1/3.5 frequency dividing on the WBL signal, or the clock signal, supplied by the switch 32, and the synchronization signal from the FSK demodulation circuit 36, controls the rotation speed of the spindle motor 22 so that the line velocity of the disk 20 becomes constant.

Figure 8:
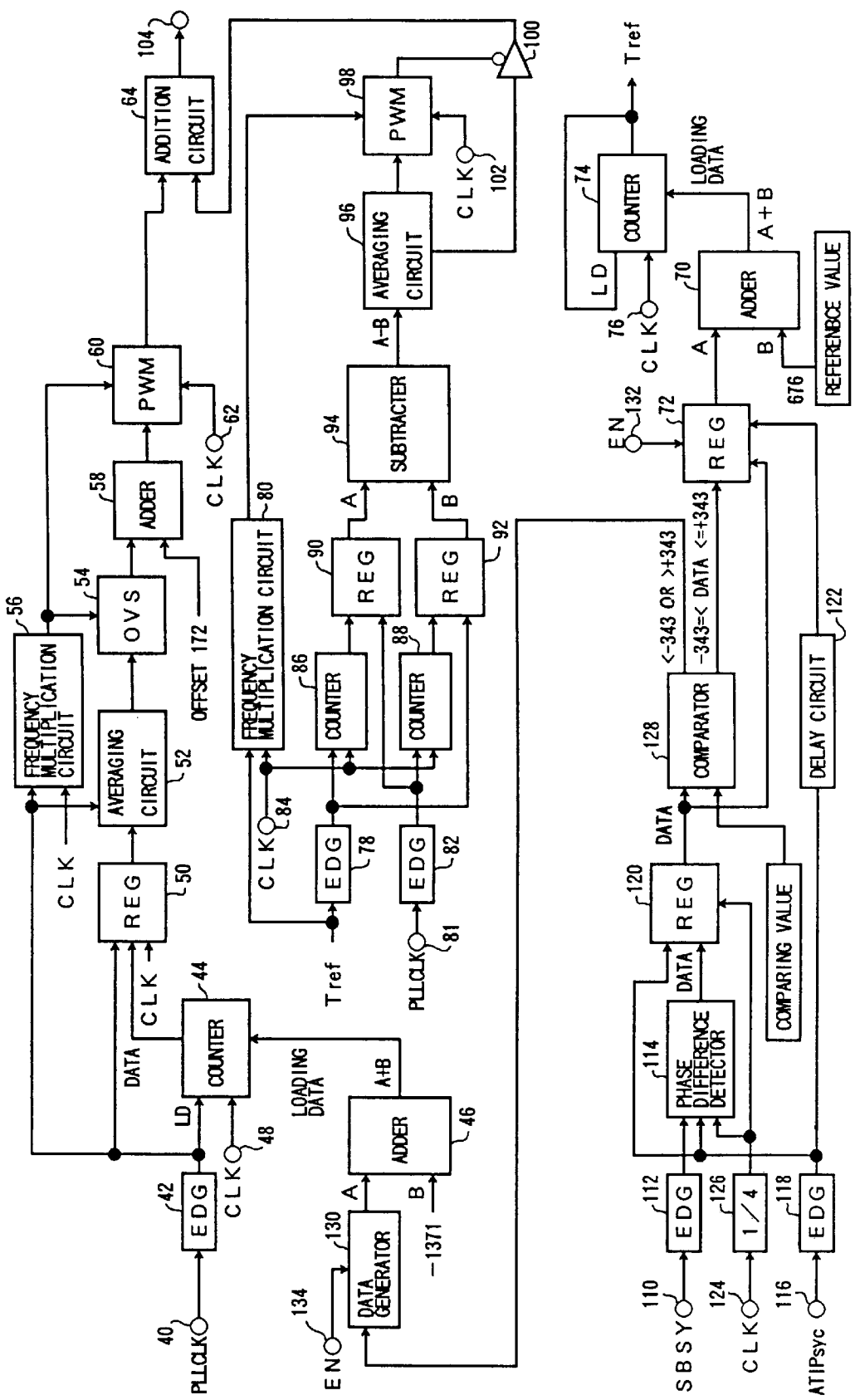
FIG. 8 shows a block diagram of the spindle servo circuit in the first embodiment of the present invention.

FIG. 8 shows a block diagram of the spindle servo circuit in the first embodiment of the present invention. The clock signal PLLCLK, output by the digital PLL circuit 30 is input to a terminal 40, and is supplied to an edge detector (EDG) 42. This clock signal is of the frequency 6.3 kHz when the operation speed is the single speed, is of the frequency 12.6 kHz when the operation speed is the double speed, and is of the frequency 25.2 kHz when the operation speed is the four-times speed. The edge detector 42 generates pulses resulting from detecting the rising edges of the clock signal.

In a counter 44, when an edge detection pulse is supplied, the value supplied by an adder 46 is loaded. Then, the counter 44 counts system clock pulses CLK supplied via a terminal 48. The output value of the adder 46 is ordinarily a reference value, −1371. The system clock pulses CLK are of a frequency 8.64 MHz when the operation speed is the single speed, are of a frequency 17.29 MHz when the operation speed is the double speed and are of a frequency 34.57 MHz when the operation speed is the four-times speed. Therefore, the counter 44, each time an edge detection pulse is input, outputs a count value 0 if the clock signal PLLCLK includes no speed error, outputs a negative count value if the clock signal PLLCLK is faster and outputs a positive count value if the clock signal PLLCLK is slower. Thus, the counter 44 outputs the count value depending on the speed error of the PLLCLK.

The count value is supplied to a register (REG) 50, and is stored therein each time an edge detection pulse is input. An averaging circuit 52 averages the count value stored in the register 50 and a predetermined number of preceding count values. Then, the resulting value is supplied to an over-sampling circuit (OVS) 54.

A frequency multiplication circuit 56 performs frequency multiplication by 4 on edge detection pulses and supplies the resulting clock signal to the over-sampling circuit 54. Using the clock signal, the over-sampling circuit 54 performs over-sampling on the output of the averaging circuit 52. Thus, approximately ¼ the output of the averaging circuit 52 is obtained, and is supplied to an adder 58. (Because sampling is performed using four-time frequency clock pulses, it is necessary to make each value to be sampled be ¼ the original value.) The adder 58 adds an offset value 172 to the over-sampling output, and supplies the resulting value to a PWM (Pulse Width Modulation) circuit 60. The offset value 172 corresponds to the 50% duty of each period of the clock pulses obtained from performing the frequency multiplication by 4.

The PWM circuit 60 is reset by each clock pulse output by the frequency multiplication circuit 56, and counts the system clock pulses CLK which are supplied via a terminal 62. The PWM circuit 60 generates a rectangular wave signal, as a speed error signal, such that the signal becomes a high level (+5 V) until the count value becomes equal to the output value of the adder 58 from 0 and then becomes a low level (0 V), and supplies the rectangular wave signal to an addition circuit 64. The counter 44 and the register 50 act as the speed error detecting means M1 shown in FIGS. 5A and 5B.

A reference value 676 and the output of a register (REG) 72 are supplied to an adder 70. The adders 70 adds these values, and supplies the resulting value to a counter 74. The output value of the register 72 is initially reset to 0. The counter 74 is an 11-bit counter, and performs feedback of each carry, output by itself, to the loading terminal thereof. Thus, in the counter 74, the output value of the adder 70 is loaded in the carry output timing, and counts the system clock pulses CLK supplied via a terminal 76. Ordinarily, the counter 74 outputs a carry each time 1372 system clock pulses are input after 676 is loaded, and thus, the counter 74 runs by itself. The carries are of a frequency 6.3 kHz when the operation speed is the single speed, and are supplied, as a reference signal Tref, to an edge detector (EDG) 78 and a frequency multiplication circuit 80.

Figure 9A:
FIGS. 9A and 9B show signal waveforms for illustrating the present invention.
Figure 9B:
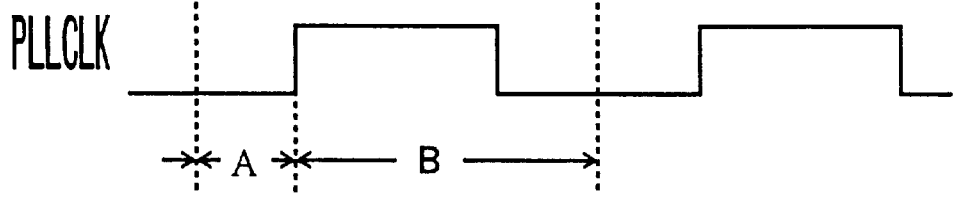

The edge detector 78 detects the rising edges of the reference signal Tref, and supplies the detection result to a register 92. The clock signal PLLCLK is supplied to an edge detector 82 via a terminal 81. The edge detector 82 detects the rising edges of the clock signal PLLCLK, and supplies the detection result to a counter 88 and a register 90. After being reset by each rising edge of the reference signal Tref, the counter 86 counts the system clock pulses CLK supplied via a terminal 84, and supplies the count value to the register 90. The register 90 stores the count value at each rising edge of the clock signal PLLCLK. After being reset by each rising edge of the clock signal PLLCLK, the counter 88 counts the system clock pulses CLK supplied via the terminal 84, and supplies the count value to the register 92. The register 92 stores the count value at each rising edge of the reference signal Tref. As a result, when the reference signal Tref and the clock signal PLLCLK are assumed to be those shown in FIGS.9A and 9B, the register 90 stores the system clock pulse count value for the period A, and the register 92 stores the system clock pulse count value for the period B.

A subtracter 94 subtracts the output value of the register 92 from the output value of the register 90, thus obtains a phase error amount A-B and supplies this amount to an averaging circuit 96. The averaging circuit 96 averages the supplied amount and a predetermined number of preceding phase error amounts. The averaging circuit 96 supplies the absolute value of the average to a PWM circuit 98 and supplies the sign of the average to the input terminal of a tristate buffer 100.

The PWM circuit 98 is reset by clock pulses which are obtained by performing frequency multiplication by 4 on the reference signal Tref through the frequency multiplication circuit 80, and counts the system clock pulses CLK supplied via a terminal 102. The PWM circuit 98 generates a rectangular wave signal such that the level of the signal is low until the count value becomes the output value of the averaging circuit 96 from 0, and then, the level of the signal becomes high, and supplies the rectangular wave signal to the control terminal of the tristate buffer 100.

The tristate buffer 100 is in an output state when the rectangular wave signal output by the PWM circuit 98 is at the low level, outputs a +5-V signal if the sign supplied by the averaging circuit 96 is positive and outputs a 0-V signal if the sign is negative. The tristate buffer 100 is in a high impedance state when the above-mentioned rectangular wave signal is at the high level. Therefore, when the duration A is equal to the duration B, the tristate buffer is in the high impedance state; when the duration A is longer than the duration B, the tristate buffer 100 outputs +5 V; and when the duration B is longer than the duration A, the tristate buffer 100 outputs 0 V. Thus, the tristate buffer 100 generates such a phase error signal and supplies the signal to the addition circuit 64.

The addition circuit 64 includes a built-in low-pass filter, and performs addition of analog voltages. The speed error signal of 0 V and 5 V is integrated by the low-pass filter and a DC value is obtained. The phase error signal of 0 V, 5 v and high impedance is integrated by the low-pass filter in which, for example, 2.5 V is taken for the high impedance state. Thus, a DC value is obtained. The addition circuit 64 adds the DC values of the speed error signal and the phase error signal, and outputs a signal of the resulting value as a servo signal via a terminal 104 to the spindle motor 22 shown in FIG. 6.

Figure 5A:
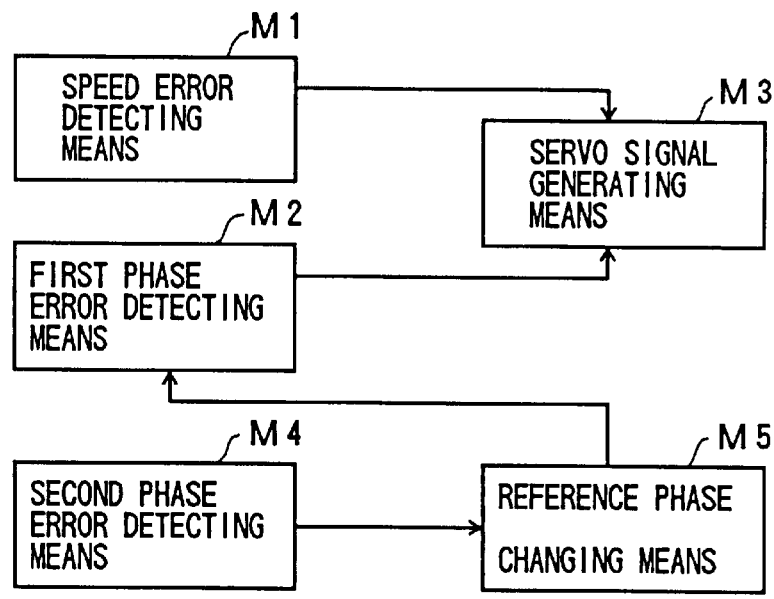
FIGS. 5A and 5B show principle diagrams of a spindle servo circuit in a first embodiment of the present invention.
Figure 5B:
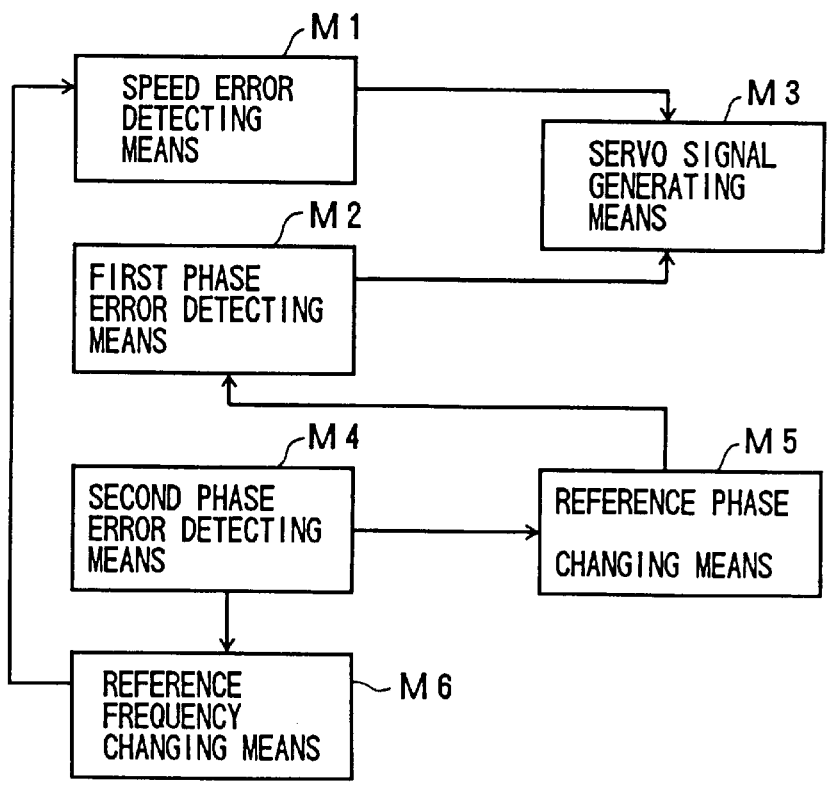

The above-mentioned counters 74, 86, 88 and subtracter 94 act as the phase error detecting means M2, and the averaging circuit 52, OVS 54, adder 58, PWM circuit 60, averaging circuit 96, PWM circuit 98, tristate buffer 100 and adder 64 act as the servo signal generating means M3, shown in FIGS. 5A and 5B.

We have described the portion of the servo circuit for performing a servo operation so that the frequency (speed) and the phase of the clock signal PLLCLK which is obtained from the BIDATA signal reproduced from the optical disk may be equal to and may be in synchronization with the frequency (speed) and the phase of the reference signal Tref which is generated from the system clock pulses CLK, respectively.

A portion of the servo circuit, which will now be described, performs a servo operation so that the phase of the synchronization signal (ATIP$_{syc}$) of a frequency of approximately 75 Hz reproduced from the optical disk 20 may be in synchronization with the phase of the synchronization signal (SBSY: sub-code sync) of a frequency of 75 Hz included in recording data.

The synchronization signal SBSY of recording data is supplied to a terminal 110, and an edge detector 112 detects the rising edges of the signal SBSY and supplies the detection result to a phase difference detector 114. The synchronization signal ATIP$_{syc}$ reproduced from the optical disk is supplied to a terminal 116, and an edge detector 118 detects the rising edges of the signal ATIP$_{syc}$ and supplies the detection result to the phase difference detector 114, a register 120 and a delay circuit 122. A frequency divider 126 performs ¼ frequency dividing on the system clock pulses CLK supplied via a terminal 124, and supplies the resulting clock pulses to the phase difference detector 114 and the register 120.

0 is loaded in the phase difference detector 114 at the time of each rising edge of the synchronization signal SBSY (or ATIP$_{syc}$), and then, the phase difference detector 114 counts the ¼ frequency divided system clock pulses until the time of the subsequent rising edge of the synchronization signal ATIP$_{syc}$ (or SBSY). Thus, the phase difference is detected as the count value. The count value is supplied to the register 120. The count value is positive when the ATIP$_{syc}$ is later, and the count value is negative when the SBSY is later. The register 120 stores the count value of the phase difference supplied at the time of the rising edge of the synchronization signal ATIP$_{syc}$ (or SBSY), and supplies the count value to a comparator 128 and the register 72. The value ±343 corresponding to one period of the clock signal PLLCLK is supplied to the comparator 128. When the above-mentioned count value is less than −343 or more than +343, that is, the phase difference is larger than one period of the clock signal PLLCLK, the comparator 128 supplies a trigger signal and the sign of phase-difference count value to a data generator 130. When the count value is equal to or more than −343 and less than or equal to +343, that is, the phase difference is equal to or smaller than one period of the clock signal PLLCLK, the comparator 128 supplies a trigger signal and the sign of the phase-difference count value to the register 72.

To the register 72, the count value output by the register 120 is supplied, and also, a signal obtained from delaying the output of the edge detector 118 through the delay circuit 122 is supplied. Further, a microprocessor (not shown in the figure) which controls the entire device supplies an enable signal EN to a terminal 132. The register 72 outputs 0 when the trigger signal is supplied if the enable signal EN is not supplied. If the enable signal EN is supplied, the register 72, when the trigger signal is supplied by the comparator 128, stores the output of the register 120, and outputs it.

Thereby, when the phase difference is equal to or smaller than one period of the clock signal PLLCLK, the phase-difference count value counted by the phase difference detector 114 is supplied to the adder 70, and is added to the reference value. Thereby, the generation timing of the reference signal Tref varies for performing a servo operation so that the synchronization signal ATIP$_{syc}$ is in synchronization with the synchronization signal SBSY.

To the data generator 130, the enable signal EN is supplied via a terminal 134. If the enable signal EN is not supplied, the data generator 130 generates 0 when the trigger signal is supplied by the comparator 128. When the enable signal EN is supplied, the data generator 130 generates a predetermined value, ±N from the trigger signal and the sign supplied by the comparator 128, and supplies the ±N to the adder 46. The sign of the ±N is the sign supplied by the comparator 128, and N is a value which was previously written by the microprocessor. For example, N is any one of 2, 3, 4.

Thus, when the phase difference is larger than one period of the PLLCLK, the data generator 130 generates the predetermined value ±N, and the ±N is added to the reference value, −1371, in the adder 46. Thereby, the value loaded in the counter 44 varies for performing a servo operation so that the synchronization signal ATIP$_{syc}$ is in synchronization with the synchronization signal SBSY.

The above-mentioned phase difference detector 114 and register 120 act as the second phase error detecting means M4, shown in FIGS. 5A and 5B, and the register 72 and adder 70 act as the reference phase changing means M5. The data generator 130 and adder 46 act as the reference frequency changing means M6.

As described above, when the phase difference of the ATIP$_{syc}$ is equal to or smaller than one period of the PLLCLK, a large value, between −343 and +343, is added to the adder 70 of the phase error system. However, when the phase difference of the ATIP$_{syc}$ is larger than one period of the PLLCLK, a small value, +2, ±3, or ±4, is added to the adder 46 of the speed error system. This is because, generally speaking, the loop gain of such a speed error system is several times to hundreds of times the loop gain of such a phase error system. Accordingly, a feedback amount to the speed error system may be smaller than a feedback amount to the phase error system.

The above-mentioned microprocessor, when the device starts, causes the switch 32, shown in FIG. 6, to select the WBL signal, and, when the rotation of the disk 20 is stabilized, causes the switch 32 to select the clock signal PLLCLK. At this time, the microprocessor does not supply the enable signal EN to the terminals 132 and 134, shown in FIG. 8. In the recording mode, after the clock signal PLLCLK comes to be in synchronization with the reference signal Tref, the microprocessor supplies the enable signal to the terminals 132 and 134, and causes the synchronization signal ATIP$_{syc}$ to be in synchronization with the synchronization signal SBSY.

In the above-described servo circuit in the first embodiment, the speed error detecting means detects the speed error which is the difference in frequency between the reproduced clock signal reproduced from the recording medium and the reference clock signal. The first phase error detecting means detects the phase error which is the difference in phase between the reproduced clock signal and the reference clock signal. The servo signal generating means generates the servo signal which is used for eliminating the above-mentioned speed error and phase error. Further, the second phase error detecting means detects the phase error which is a phase difference between the synchronization signal reproduced from the recording medium separately from the above-mentioned reproduced clock signal and the reference synchronization signal. The reference phase changing means changes the phase of the reference clock signal based on the phase error detected by the second phase error detecting means.

Thus, in the embodiment, the phase of the reference clock signal, which is used for detecting the phase error of the reproduced clock signal, is changed based on the phase error of the reproduced synchronization signal reproduced from the recording medium. Thereby, there is only one phase system servo loop, and the servo signal is generated by adding the phase error of the reproduced clock signal and the phase error of the reproduced synchronization signal. Thereby, it is possible to correct the phase errors of the two systems at the same time.

Further, by changing the frequency of the reference clock signal based on the phase error of the reproduced synchronization signal, the time required for correcting the phase error of the reproduced synchronization signal can be reduced. Thus, the stabilized reproduced clock signal and reproduced synchronization signal can be reproduced earlier.

However, changing the frequency of the reference clock signal based on the phase error of the synchronization signal may not be performed. An embodiment of the present invention is not limited to the above-described first embodiment.

In the first embodiment, the speed error signal, which is the rectangular wave of the pulse width corresponding to the speed error, and the phase error signal, which is the rectangular wave of the pulse width corresponding to the phase error, are generated. Each of these error signals is integrated through the low-pass filter, and then, is added to one another in an analog calculation manner. Thus, the servo signal is obtained and is supplied to the spindle motor.

When the speed error loop gain is changed from a single amount, to a four-times amount and to a sixteen-times amount in order to change the operation speed from the single speed, to the double speed and to the four-times speed, the phase error loop gain should also be changed from a single amount, to a four-times amount and to a sixteen-times amount. Thus, the multiplication rate of the speed error loop gain should be the same as the multiplication rate of the phase error loop gain.

For this purpose, in the first embodiment, the two registers for holding the count values of the two counters, respectively, the subtracter, and the pulse width modulation circuit for changing the duty ratio of the phase error signal using the output of the subtracter should be provided. Thereby, the circuit scale is large.

Therefore, it has been requested to provide a servo circuit in which the phase error gain can be changed according to a change of the speed error gain, the circuit arrangement is simple and the circuit scale is small.

For this purpose, according to another aspect of the present invention, a servo circuit comprises speed error detecting means, phase error detecting means and servo signal generating means. The speed error detecting means detects the speed error which is the difference in frequency between the reproduced clock signal reproduced from the recording medium and the reference clock signal. The phase error detecting means detects the phase error which is the difference in phase between the reproduced clock signal and the reference clock signal. The servo signal generating means generates the servo signal which is used for eliminating the above-mentioned speed error and phase error. Further, the phase error detecting means comprises first and second frequency dividing means and phase comparing means. The first and second frequency dividing means perform frequency dividing on the reproduced clock signal and the reference clock signal, respectively. The frequency dividing ratio is changed according to a change of the speed error gain of the speed error detecting means. The phase comparing means detects the phase error between the frequency-divided reproduced clock signal and the frequency-divided reference clock signal.

Thus, the frequency dividing ratio of the reproduced clock signal and the reference clock signal is changed according to a change of the speed error gain. Thereby, the phase error detecting period is changed. As a result, the phase error gain is changed according to the speed error gain, and the pulse width modulation circuit and so forth are not needed. Thus, the circuit arrangement can be simpler and the circuit scale can be reduced.

Figure 10:
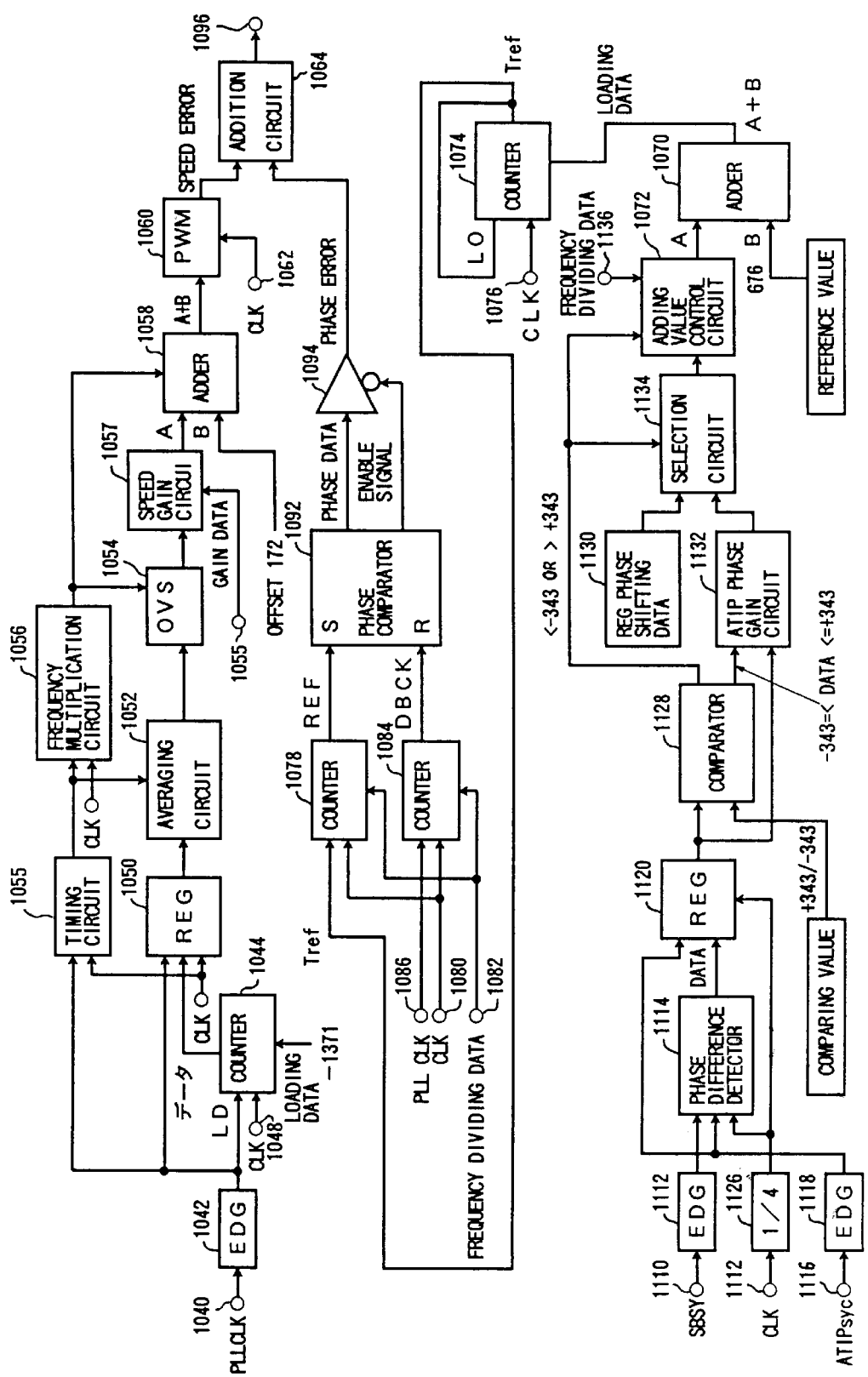
FIG. 10 shows a block diagram of the spindle servo circuit in the second embodiment in the present invention.

FIG. 10 shows a block diagram of the spindle servo circuit in the above-mentioned second embodiment to which the above-mentioned other aspect of the present invention is applied. The reproduced clock signal PLLCLK, reproduced from the recording medium and output by the digital PLL circuit 30, shown in FIG. 6, is input to a terminal 1040, and is supplied to an edge detector (EDG) 1042. This clock signal is of the frequency 6.3 kHz when the operation speed is the single speed, is of the frequency 12.6 kHz when the operation speed is the double speed, and is of the frequency 25.2 kHz when the operation speed is the four-times speed. The edge detector 1042 generates pulses resulting from detecting the rising edges of the clock signal.

In a counter 1044, when an edge detection pulse is supplied, a reference value −1371 is loaded. Then, the counter 1044 counts system clock pulses CLK supplied via a terminal 1048. The system clock pulses CLK are of a frequency 8.64 MHz when the operation speed is the single speed, are of a frequency 17.29 MHz when the operation speed is the double speed and are of a frequency 34.57 MHz when the operation speed is the four-times speed. Therefore, the counter 1044, each time an edge detection pulse is input, outputs a count value 0 if the clock signal PLLCLK includes no speed error, outputs a negative count value if the clock signal PLLCLK is faster and outputs a positive count value if the clock signal PLLCLK is slower. Thus, the counter 1044 outputs the count value depending on the speed error of the PLLCLK.

The count value is supplied to a register (REG) 1050, and is stored therein each time an edge detection pulse is input. An averaging circuit 1052 averages the count value stored in the register 1050 and a predetermined number of preceding count values. Then, the resulting value is supplied to an over-sampling circuit (OVS) 1054.

The edge detection pulses are caused to be in synchronization with the system clock pulses, and then are supplied to a frequency multiplication circuit 1056. The frequency multiplication circuit 1056 performs frequency multiplication by 4 on the edge detection pulses. The clock pulses obtained from performing the frequency multiplication by 4 on the edge detection pulses through the frequency multiplication circuit 1056 are supplied to the over-sampling circuit 1054. Using the clock pulses, the over-sampling circuit 1054 performs over-sampling on the output of the averaging circuit 1052. Thus, approximately ¼ of the output of the averaging circuit 1052 is obtained, and is supplied to a speed gain circuit 1057. (Because sampling is performed using four-times frequency clock pulses, it is necessary to make each value to be sampled be ¼ of the original value.)

Gain data is supplied to the speed gain circuit 1057 via a terminal 1055 from a microprocessor (not shown in the figure). The gain data indicates, for example, a frequency dividing ratio 1/16 when the operation speed is the single speed, a frequency dividing ratio ¼ when the operation speed is the double speed, and a frequency dividing ratio 1 when the operation speed is the four-times speed. The speed gain circuit 1057 multiplies the value supplied by the over-sampling circuit 1054 by the above-mentioned gain data, and supplies the resulting value to an adder 1058. Thereby, if the speed loop gain when the operation speed is the single speed is used as a reference, the gain is four times the reference when the operation speed is the double speed and the gain is sixteen times the reference when the operation speed is the four-times speed. The adder 1058 adds an offset value 172 to the over-sampling output, and supplies the resulting value to a PWM (Pulse Width Modulation) circuit 1060. The offset value 172 corresponds to the 50% duty of each period of the clock pulses obtained from performing the frequency multiplication by 4.

The PWM circuit 1060 is reset by each clock pulse output by the frequency multiplication circuit 1056, and counts the system clock pulses CLK which are supplied via a terminal 1062. The PWM circuit 1060 generates a rectangular wave signal, as a speed error signal, such that the signal is at a high level (+5 V) until the count value becomes equal to the output value of the adder 1058 from 0 and then becomes a low level (0 V), and supplies the rectangular wave signal to an addition circuit 1064. The counter 1044 and the register 1050 act as the speed error detecting means.

A reference value 676 and the output of an adding value control circuit 1072 are supplied to an adder 1070. The adder 1070 adds these values, and supplies the resulting value to a counter 1074. The output value of the adding value control circuit 1072 is initially reset to 0. The counter 1074 is an 11-bit counter, and performs feedback of each carry, output by itself, to the loading terminal thereof. Thus, in the counter 1074, the output value of the adder 1070 is loaded in the carry output timing, and counts the system clock pulses CLK supplied via a terminal 1076. Ordinarily, the counter 1074 outputs a carry each time 1372 system clock pulses are input after 676 is loaded, and thus, the counter 1074 runs by itself. The carries are of a frequency 6.3 kHz when the operation speed is the single speed, and are supplied, as a reference signal (reference clock signal) Tref, to a counter 1078.

The counter 1078, acting as the first frequency dividing means, is in synchronization with the system clock pulses CLK supplied via a terminal 1080. The counter 1078 performs frequency dividing on the reference signal Tref according to the instructions of frequency dividing data supplied via a terminal 1082, and outputs a signal REF. Specifically, when the operation speed is the single speed, the counter 1078 performs ⅟₁₆ frequency dividing on the reference signal Tref and outputs the signal REF such that the signal has the value 0 during eight periods of the Tref and the signal has the value 1 during the subsequent eight periods of the Tref. When the operation speed is the double speed, the counter 1078 performs ¼ frequency dividing on the reference signal Tref and outputs the signal REF such that the signal has the value 0 during two periods of the Tref and the signal has the value 1 during the subsequent two periods of the Tref. When the operation speed is the four-times speed, the counter 1078 performs ⅟₁ frequency dividing on the reference signal Tref. In this case, the counter 1078 does not perform frequency dividing and the signal REF is equal to the reference signal Tref. Similarly, a counter 1084, acting as the second frequency dividing means, is in synchronization with the system clock pulses CLK. The counter 1084, according to the frequency dividing data, performs frequency dividing on the clock signal (reproduced clock signal) PLLCLK and outputs a signal DBCK.

The signal REF output by the counter 1078 is supplied to a terminal S of a phase comparator 1092, and the signal DBCK output by the counter 1084 is supplied to a terminal R of the phase comparator 1092. The phase comparator 1092, acting as the phase comparing means, includes an SR flip-flop and an exclusive-OR circuit. The Q output of the flip-flop, which is set at the time of each rising edge of the signal REF and is reset at the time of each rising edge of the signal DBCK, is supplied to a tristate buffer 1094 as phase data. Further, the output of the exclusive OR when each of the signal REF and the signal DBCK rises (except the exclusive OR when each of the signals decays) is supplied to the control terminal of the tristate buffer 1094, as an enable signal. The enable signal is at a low level when the output of the exclusive OR is 1 and the enable signal is at a high level when the output of the exclusive OR is 0.

Thereby, when the signals REF and DBCK are such as those shown in FIGS. 11A and 11B, respectively, for example, the phase data shown in FIG. 11C is obtained. When the signals REF and DBCK are such as those shown in FIGS. 12A and 12B, respectively, for example, the phase data shown in FIG. 12C is obtained. The tristate buffer 1094 is in the output state when the enable signal is at the low level, and is in the high impedance state when the enable signal is at the high level. As a result, when the phase data is such as that shown in FIG. 11C, only the low-level phase data is supplied to the addition circuit 1064 from the tristate buffer 1094, as a phase error signal. When the phase data is such as that shown in FIG. 12C, only the high-level phase data is supplied to the addition circuit 1064 from the tristate buffer 1094, as the phase error signal. The output voltage of the tristate buffer 1064 is 5 V for the high level and is 0 V for the low level.

Thus, the frequency dividing ratio of the reproduced clock signal and the reference clock signal is changed according to the frequency dividing data, simultaneously with a change of the speed error gain according to the gain data corresponding to the frequency dividing data. Thereby, the phase error detecting period is changed. As a result, the phase error gain is changed according to the change of the speed error gain, and the pulse width modulation circuit and so forth provided in the first embodiment are not needed. Thus, the circuit arrangement can be simpler and the circuit scale can be reduced.

The addition circuit 1064 includes a built-in low-pass filter, and performs addition of analog voltages. The speed error signal of 0 V and 5 V supplied by the PWM circuit 1060 is integrated by the low-pass filter and a DC value is obtained. The phase error signal of 0 V, 5 V and high impedance supplied by the tristate buffer 1094 is integrated by the low-pass filter in which, for example, 2.5 V is taken for the high impedance state. Thus, a DC value is obtained. The addition circuit 1064 adds the DC values of the speed error signal and the phase error signal, and outputs a signal of the resulting value as a servo signal via a terminal 1096 to the spindle motor 22 shown in FIG. 6.

The above-mentioned counters 1078, 1084, and the phase comparator 1092 act as the phase error detecting means, and the averaging circuit 1052, OVS 1054, speed gain circuit 1057, adder 1058, PWM circuit 1060, tristate buffer 1094 and adder 1064 act as the servo signal generating means.

We have described the portion of the servo circuit for performing a servo operation so that the frequency (speed) and the phase of the clock signal PLLCLK which is obtained from the BIDATA signal reproduced from the optical disk may be equal to and may be in synchronization with the frequency (speed) and the phase of the reference signal Tref which is generated from the system clock pulses CLK, respectively.

The portion of the servo circuit, which will now be described, performs a servo operation so that the phase of the synchronization signal (ATIP$_{syc}$) of a frequency of approximately 75 Hz reproduced from the optical disk 20 may be in synchronization with the phase of the synchronization signal (SBSY: sub-code sync) of a frequency of 75 Hz included in recording data.

The synchronization signal SBSY of recording data is supplied to a terminal 1110, and an edge detector 1112 detects the rising edges of the signal SBSY and supplies the detection result to a phase difference detector 1114. The synchronization signal ATIP$_{syc}$ reproduced from the optical disk is supplied to a terminal 1116, and an edge detector 1118 detects the rising edges of the signal ATIP$_{syc}$ and supplies the detection result to the phase difference detector 1114 and a register 1120. A frequency divider 1126 performs ¼ frequency dividing on the system clock pulses CLK supplied via a terminal 1124, and supplies the resulting clock pulses to the phase difference detector 1114 and the register 1120.

0 is loaded in the phase difference detector 1114 at the time of each rising edge of the synchronization signal SBSY (or ATIP$_{syc}$), and then, the phase difference detector 1114 counts the ¼ frequency divided system clock pulses until the time of the subsequent rising edge of the synchronization signal ATIP$_{syc}$ (or SBSY). Thus, the phase difference is detected as the count value. The count value is supplied to the register 1120. The count value is positive when the ATIP$_{syc}$ is later, and the count value is negative when the SBSY is later. The register 1120 stores the count value of the phase difference supplied at the time of each rising edge of the synchronization signal ATIP$_{syc}$ (or SBSY), and supplies the count value to a comparator 1128 and an ATIP phase gain circuit 1132.

The comparing value ±343 corresponding to one period of the clock signal PLLCLK is supplied to the comparator 1128. The comparator 1128 supplies a flag signal to a selection circuit 1134 and the adding value control circuit 1072. The flag signal indicates ON when the above-mentioned count value is less than −343 or more than +343, that is, when the phase difference is larger than one period of the clock signal PLLCLK. The flag signal indicates OFF when the above-mentioned count value is equal to or more than −343 and less than or equal to +343. When the above-mentioned count value is equal to or more than −343 and less than or equal to +343, that is, then the phase difference is equal to or smaller than one period of the clock signal PLLCLK, the comparator 1128 supplies a trigger signal to the ATIP phase gain circuit 1132.

The selection circuit 1134 selects phase shifting data set in a register 1130 when the phase difference is larger than one period of the clock signal PLLCLK and the ON flag signal is supplied. The selection circuit 1134 selects the phase error data output by the ATIP phase gain circuit 1132 when the OFF flag signal is supplied. The selection circuit 1134 supplies the selected data to the adding value control circuit 1072. In the register 1130, the phase shifting data for shifting phase at high speed is set by the microprocessor. The phase shifting data is, for example, approximately 80 when the operation speed is the single speed, and approximately 40 when the operation speed is the double speed.

When the trigger signal is supplied by the comparator 1128, the ATIP phase gain circuit 1132 generates the phase error data as a result of multiplying the phase-difference count value, supplied by the register 1120, by a predetermined gain (positive value less than 1, or 0). Selection of one of the positive value less than 1 and 0 is performed according to instructions by the microprocessor. The generated phase error data is supplied to the selection circuit 1134. Ordinarily, the maximum value of the phase error data is less than the phase shifting data.

The frequency dividing data is supplied to the adding value control circuit 1072 via a terminal 1136. The flag signal is supplied to the adding value control circuit 1072 from the comparator 1128. The adding value control circuit 1072, when the frequency dividing data specifies 1/N frequency dividing, supplies the phase shifting data or the phase error data, supplied by the selection circuit 1134, to the adder 1070 once per N periods of the reference signal Tref. Thus, according to the frequency dividing data, the adding value control circuit 1072 controls the adding value to be supplied to the adder 1070. Further, when the gain of the ATIP phase gain circuit 1132 is selected to be 0 by the microprocessor, after the flag signal indicates OFF, during 64 periods of the reference signal Tref, the gain of the ATIP phase gain circuit 1132 is automatically selected by the microprocessor to be the positive value less than 1. After the 64 periods have elapsed, the gain of the ATIP phase gain circuit 1132 is selected to be 0. This is because, if the phase error data is 0 immediately after the flag signal indicates OFF, phase control is stopped and a state where the rising edges of the ATIP$_{syc}$ are not in synchronization with the rising edges of the SBSY may occur, which should be prevented.

In the embodiment, based on the phase error data when the phase difference is equal to or smaller than one period of the clock signal PLLCLK or based on the phase shifting data when the phase difference is larger than one period of the clock signal PLLCLK, and also, as a result of the adding value being obtained for causing the phase error loop gain to correspond to the speed error loop gain and the obtained adding value being supplied to the adder 1070, the generation timing of the reference signal Tref is changed. Thus, a servo operation is performed so that the synchronization signal ATIP$_{syc}$ may be in synchronization with the synchronization signal SBSY.

The microprocessor causes the switch 32, shown in FIG. 6, to select the WBL signal when the device starts, and then, causes the switch 32 to select the clock signal PLLCLK when the rotation of the optical disk 20 is stabilized. At this time, if the microprocessor gives instructions that the phase control of the synchronization signal ATIP$_{syc}$ and the synchronization signal SBSY is to be performed, the phase control of the synchronization signal ATIP$_{syc}$ and the synchronization signal SBSY is performed and phase control of the signal REF and the signal DBCK is performed simultaneously. Thereby, the synchronization signal ATIP$_{syc}$ is in synchronization with the synchronization signal SBSY. However, if the microprocessor gives instructions that the phase control of the synchronization signal ATIP$_{syc}$ and the synchronization signal SBSY is not to be performed, the phase control of the synchronization signal ATIP$_{syc}$ and the synchronization signal SBSY is not performed. Then, when the microprocessor gives instructions that the phase control of the synchronization signal ATIP$_{syc}$ and the synchronization signal SBSY is to be performed, the phase control of the synchronization signal ATIP$_{syc}$ and the synchronization signal SBSY is performed, and thereby, the synchronization signal ATIP$_{syc}$ is in synchronization with the synchronization signal SBSY.

Figure 13:
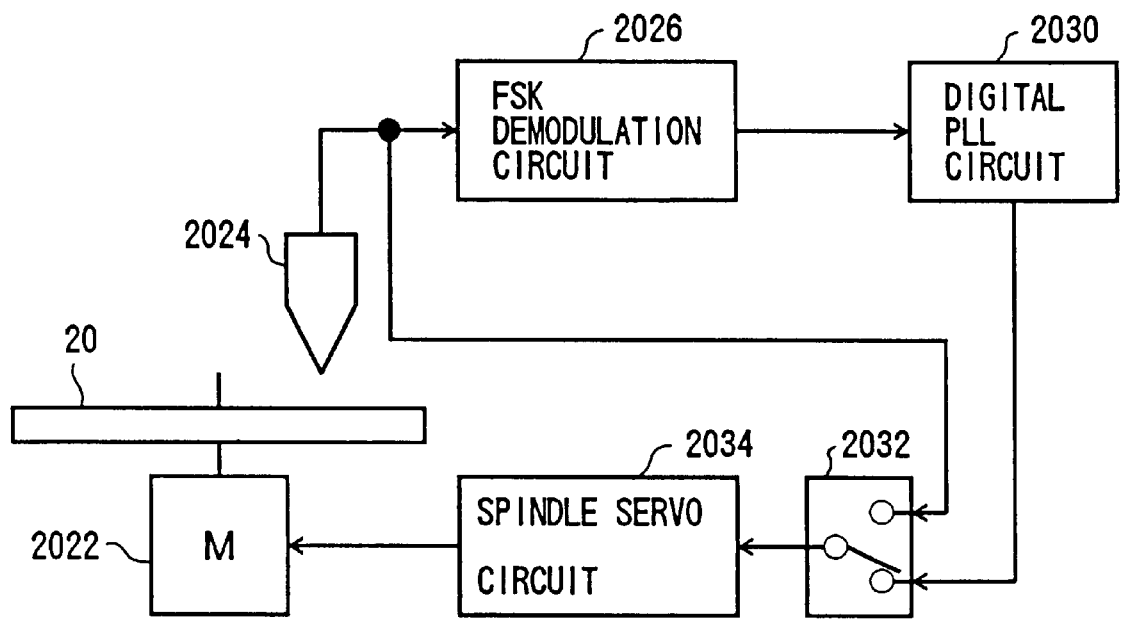
FIG. 13 shows a block diagram of an example of an optical disk device (CD-R recording servo system), to which a digital PLL circuit in a third embodiment of the present invention can be applied.

FIG. 13 shows a block diagram of an example of a CD-R recording servo system, to which a digital PLL circuit in a third embodiment of the present invention, which will be described later, can be applied. In the figure, an optical disk 20 is rotated by a spindle motor 2022. An optical pickup 2024 reproduces a wobble signal shown in FIG. 7B from the disk 20, and outputs a WBL signal shown in FIG. 7C. The WBL signal shown in FIG. 7C is obtained from converting the wobble signal shown in FIG. 7B into a two-level signal.

The WBL signal is supplied to an FSK demodulation circuit 2026, and a BIDATA signal shown in FIG. 7A is obtained from the demodulation. The BIDATA signal is supplied to the digital PLL circuit 2030. The digital PLL circuit 2030 generates a clock signal which is in synchronization with the BIDATA signal and supplies the clock signal to a switch 2032. The switch 2032 selects the reproduced WBL signal when rotation of the disk 20 is started. When the rotation of the disk 20 is stabilized, the switch 2032 selects the clock signal, output by the digital PLL circuit 2030, and supplies the selected signal to a spindle servo circuit 2034. The spindle servo circuit 2034, based on the signal obtained from performing 1/13.5 frequency dividing on the WBL signal, or the clock signal, supplied by the switch 2032, controls the rotation speed of the spindle motor 2022 so that the line velocity of the disk 20 becomes constant.

Figure 1:
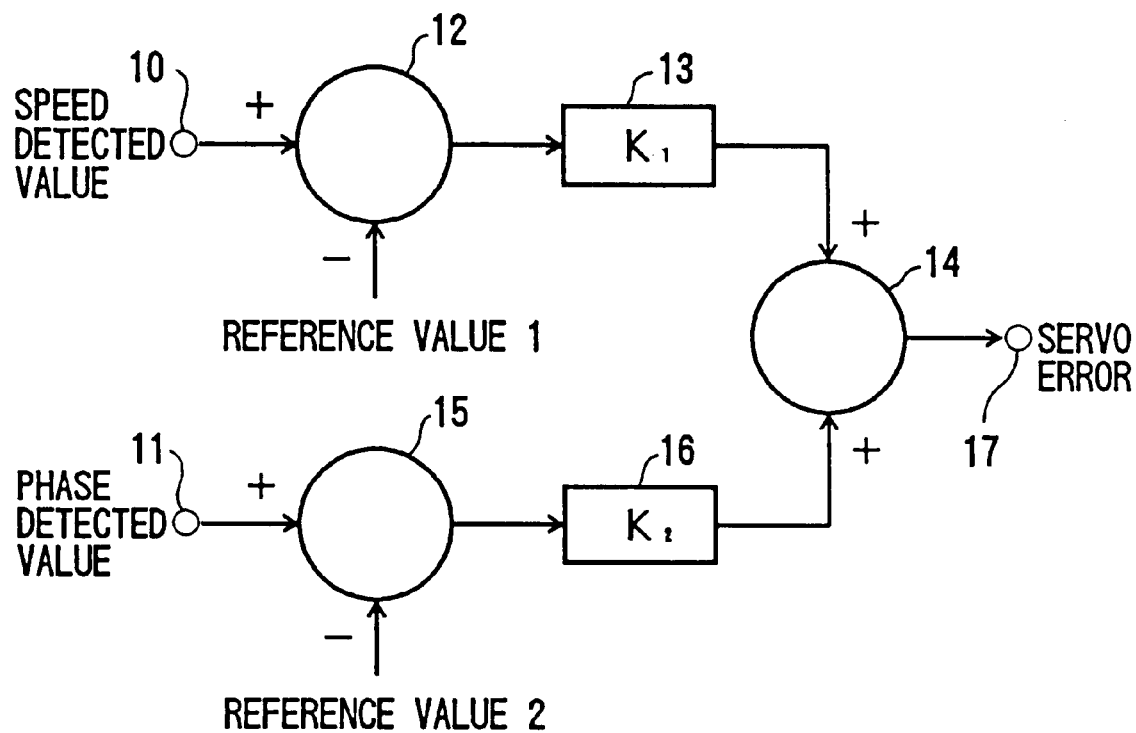
FIG. 1 shows a block diagram of an example of a servo circuit in the related art.
Figure 2:
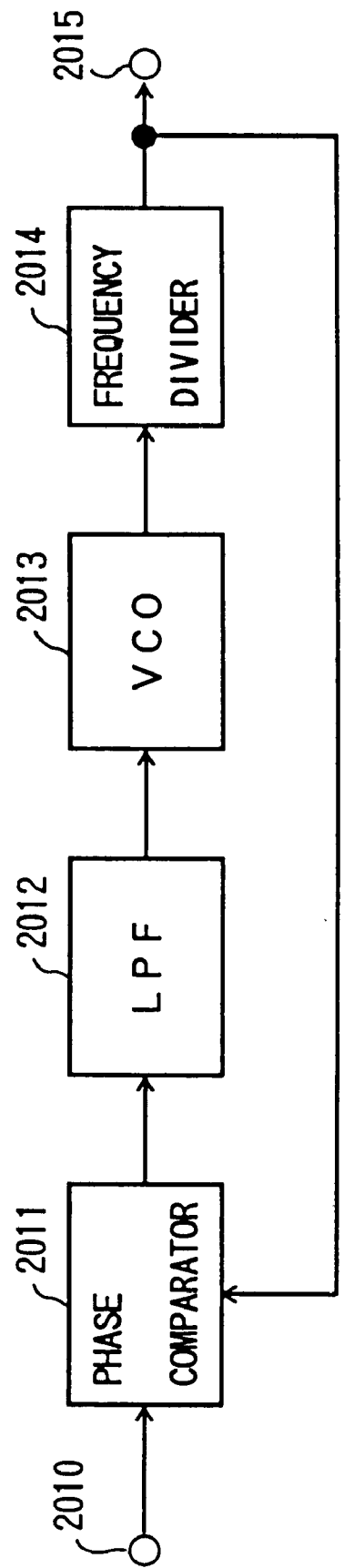
FIG. 2 shows a block diagram of an example of an analog PLL (Phase-Locked Loop) circuit in the related art.
Figure 3A:
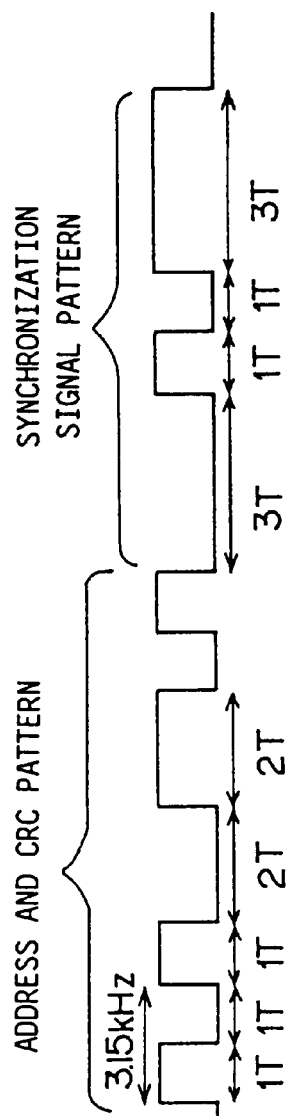
FIGS. 3A and 3B show signal waveforms for illustrating the related art.
Figure 14:
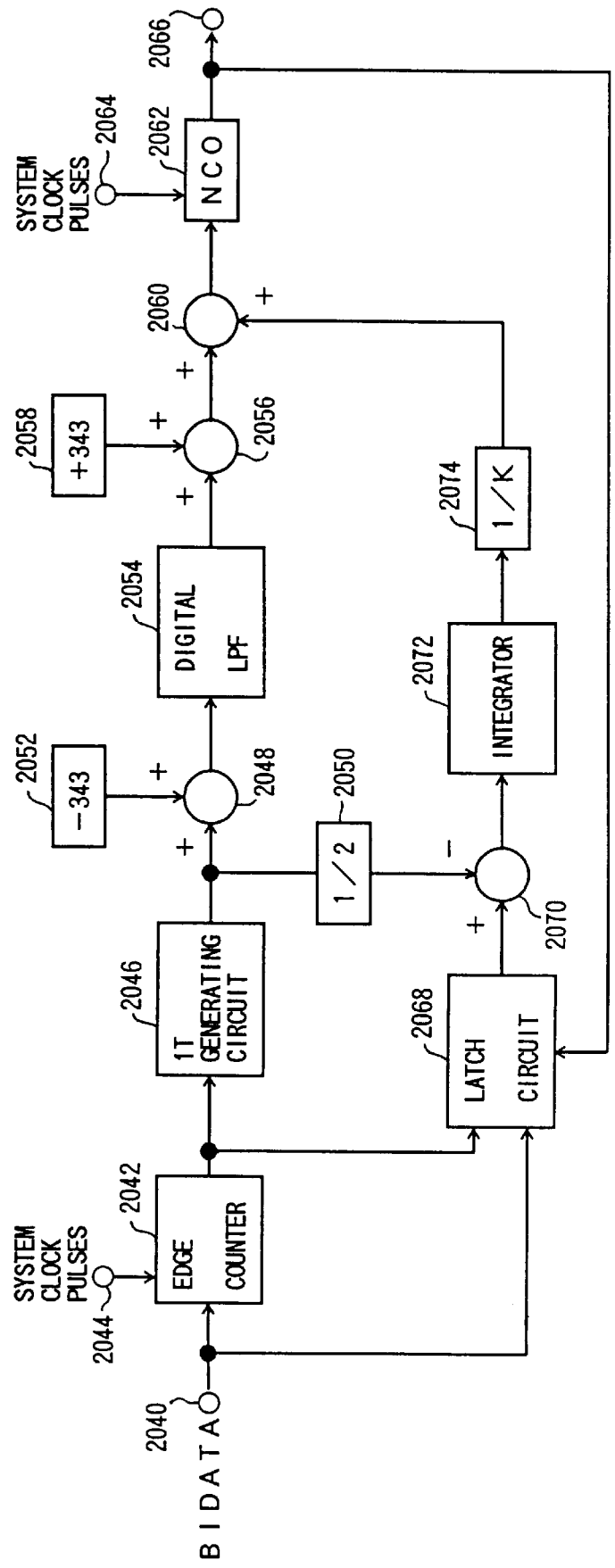
FIG. 14 shows a block diagram of the digital PLL circuit in the third embodiment of the present invention.

FIG. 14 shows a block diagram of the digital PLL circuit 2030 in the third embodiment of the present invention. In the figure, a BIDATA signal, such as that shown in FIG. 3A, is input to a terminal 2040 and is supplied to an edge counter 2042. The edge counter 2042, acting as the measuring means, is reset at the rising edges and the decaying edges, and counts system clock pulses which are input via a terminal 2044. Thus, the edge counter measures the edge durations of the BIDATA signal and outputs them. The frequency of the system clock pulses is changed from the single-speed frequency, to double the single-speed frequency and to four times the single-speed frequency as the operation speed of the disk 20 is changed from the single speed, to the double speed and to the four-times speed. In each operation speed, the number of system pulses during the pulse width 1T of the BIDATA signal is 686 as a standard. Thereby, as a standard, the count value of the edge counter 2042 for the pulse width 1T is 686, the count value for the pulse width 2T is 1372, and the count value for the pulse width 3T is 2058.

A 1T generating circuit 2046 determines whether or nor the count value, supplied by the edge counter 2042 immediately before the count value becomes 0, that is, the maximum count value, is within the range of 686±α (where α is a value on the order of 10) or within the range of 1372±2α. When the maximum count value is in the range of 686±α, the maximum count value is held as the value of 1T. When the maximum count value is in the range of 1372±2α, ½ of the maximum count value is held as the value of 1T. Thus, the 1T generating circuit 2046 detects the pulse widths 1T, 2T of the BIDATA signal, generates the value of 1T, and ignores the pulse width 3T of the BIDATA signal. The value of 1T near the value 686, output by the 1T generating circuit, is supplied to an adder 2048 and to a multiplier 2050.

The adder 2048 adds the fixed value −343, supplied by a fixed-value generator 2052, to the value of 1T in order to reduce the number of bits. The added result is supplied to a digital low-pass filter 2054.

The digital low-pass filter 2054 removes sharp fluctuation components of the supplied value, and supplies the resulting value to an adder 2056. The adder 2056 adds the fixed value 343, supplied by a fixed-value generator 2058, to the supplied value. Thus, the value 1T is obtained. The value 1T is supplied to an adder 2060. The adder 2060 adds a phase error correction value to the supplied value. The corrected value of 1T is supplied to an NCO (Numerically Controlled Oscillator) 2062.

The system clock pulses are supplied to the NCO 2062 via a terminal 1064. The NCO counts the system clock pulses and generates the clock signal shown in FIG. 3B which rises when the count value of the system clock pulses becomes the value of 1T from the adder 2060, and resets the count value. The clock signal is output via a terminal 2066, and also, is supplied to a latch circuit 2068. The above-mentioned 1T generating circuit 2046 and the adder 2048 to the NCO 2062 act as the clock generating means.

The count value output by the edge counter 2042 is supplied to the latch circuit 2068. The latch circuit 2068 holds the supplied count value at each rising of the clock signal supplied by the NCO 2062, and supplies the held count value to a subtracter 2070. However, the latch circuit 2068, to which the BIDATA signal is also supplied, holds the count value at only the first rising of the clock signal from the starting edge of each of the pulse widths 1T, 2T and 3T of the BIDATA signal, and does not hold the count value at second (in the case of 2T, 3T) nor third (in the case of 3T) rising, in the same pulse width, of the clock signal.

Figure 3B:
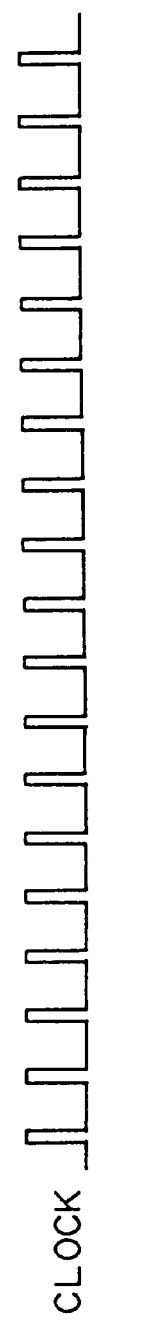
Figure 4:
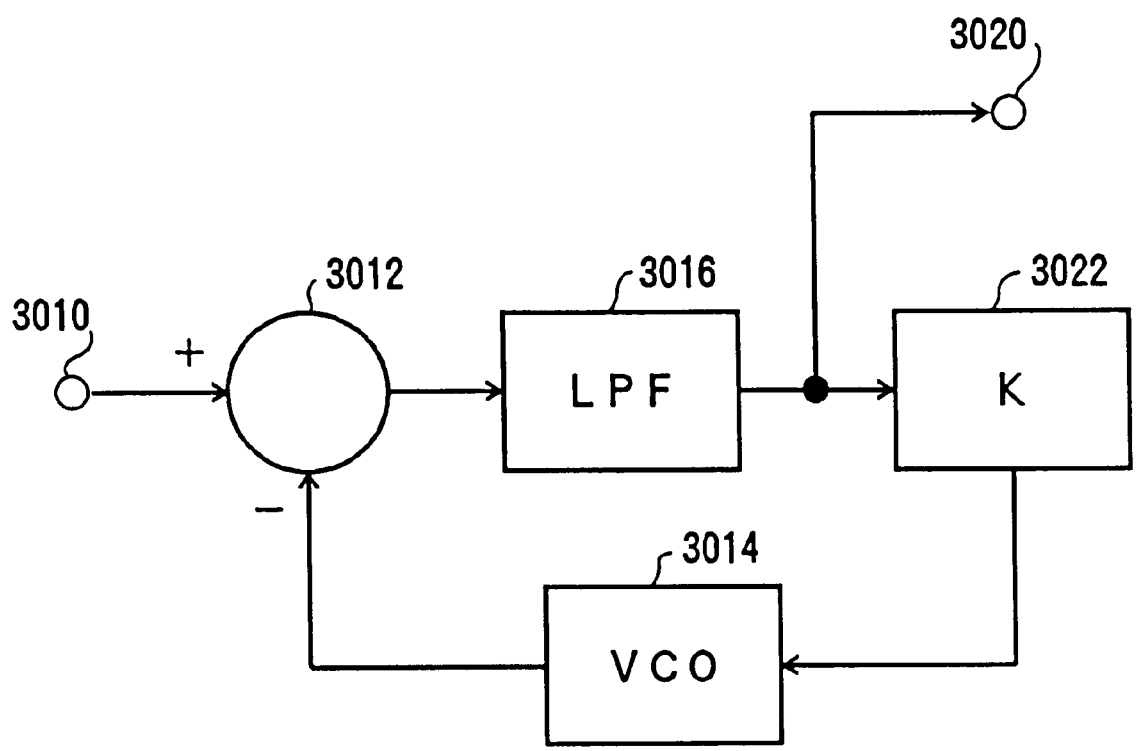
FIG. 4 shows a block diagram of an example of an FSK demodulation circuit in the related art.

To the subtracter 2070, the value obtained from multiplying the value of 1T, output by the 1T generating circuit 2046, by ½ through the multiplier 2050 is supplied, as a reference value. The subtracter 2070 subtracts the reference value from the value output by the latch circuit 2068, and thus obtains a phase error value. The phase error value is supplied to an integrator 2072. The reason why ½ of the value of 1T is used as the reference value is that, as shown in FIGS. 3A, 3B, rising of the clock signal is positioned at the center of each pulse width 1T.

The integrator 2072 performs proportional integration on the phase error value. The integrated value is multiplied by 1/K (where K is a real number equal to or more than 1) through a multiplier 2074. Thus, the phase error correction value is obtained and is supplied to the adder 2060. The multiplier 2050, latch circuit 2068 to multiplier 2074 and adder 2060 act as the phase correcting means.

Thus, the 1T generating circuit 2046 generates the value of 1T only from the pulse widths 1T and 2T of the BIDATA signal, and does not use the pulse width 3T of the BIDATA signal. The repeating frequency 75 Hz (in the single speed) synchronization signal ($ATIP_{syc}$) in the BIDATA signal is of the pattern of 3T, 1T, 1T and 3T as shown in FIG. 3A. Because the 1T generating circuit 2046 does not use the 3T pattern, there is no possibility that a 75-Hz component of the synchronization signal is mixed into the output value of the 1T generating circuit 2046. Thereby, stabilization of the clock signal is improved.

Further, not only a frequency system of the 1T generating circuit 2046 to adder 2048, digital low-pass filter 2054 and adder 2056, but also a phase system of the multiplier 2050, latch circuit 2068 to adder 2070, integrator 2072 and adder 2074 are provided. Because the clock signal is generated by the frequency system and phase system through the adder 2060, the stabilized clock signal in synchronization with the BIDATA signal can be generated. Further, in the embodiment, the entirety of the digital PLL circuit is formed of a digital circuit. Accordingly, the operation is stable against ambient temperature and power supply voltage fluctuation in comparison to an analog circuit. Further, when the circuit is formed to be an integrated circuit, no externally connected circuit is required. Further, only by changing the frequency of the system clock pulses supplied via the terminals 2044 and 2064, it is possible to configure the circuit for the operation speed, the single speed, double speed and four-times speed. Further, the circuit operates based on the count value of the edge counter 2042, linearity is good and the capture range of the phase locking operation is wider.

In the embodiment, the 1T generating circuit generates the value of 1T from the detected values of the pulse widths 1T and 2T of the BIDATA signal. However, it is also possible that the 1T generating circuit generates the value of 1T only from the detected values of the pulse width 1T of the BIDATA signal. An embodiment of the present invention is not limited to the above-described embodiment.

Figure 15:
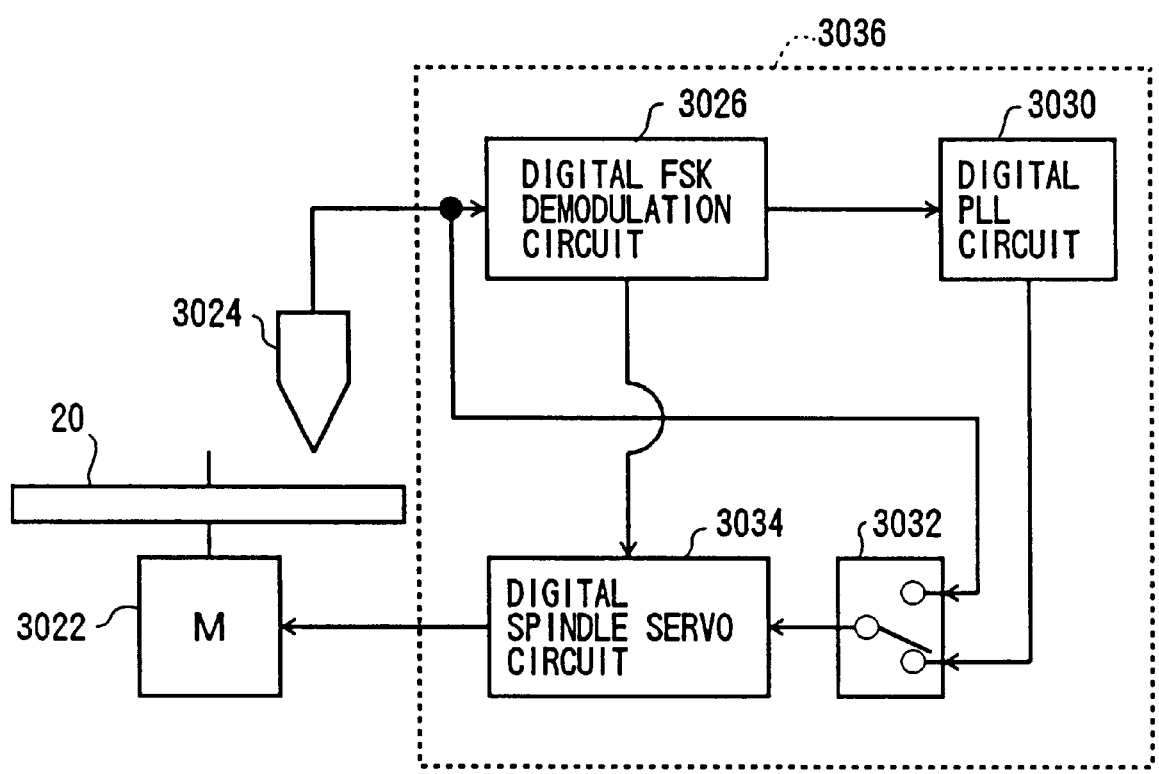
FIG. 15 shows a block diagram of an optical disk device in a fourth embodiment of the present invention.

FIG. 15 shows a block diagram of an optical disk device in a fourth embodiment of the present invention. In the figure, an optical disk 20 is rotated by a spindle motor 3022. An optical pickup 3024 reproduces a wobble signal shown in FIG. 7B from the disk 20, and outputs a WBL signal shown in FIG. 7C. The WBL signal shown in FIG. 7C is obtained from converting the wobble signal shown in FIG. 7B into a two-level signal.

The WBL signal is supplied to a digital FSK demodulation circuit 3026, and a BIDATA signal shown in FIG. 7A is obtained from the demodulation. Further, the synchronization signal (ATIP$_{syc}$) is detected in the digital FSK demodulation circuit 3026. The BIDATA signal is supplied to the digital PLL circuit 3030. The digital PLL circuit 3030 generates a clock signal which is in synchronization with the BIDATA signal and supplies the clock signal to a switch 3032. The switch 3032 selects the reproduced WBL signal when rotation of the disk 20 is started. When the rotation of the disk 20 is stabilized, the switch 3032 selects the clock signal, output by the digital PLL circuit 3030, and supplies the selected signal to a digital spindle servo circuit 3034. The digital spindle servo circuit 3034, based on the signal obtained from performing ⅓.5 frequency dividing on the WBL signal, or the clock signal, supplied by the switch 3032, and the synchronization signal, controls the rotation speed of the spindle motor 3022 so that the line velocity of the disk 20 becomes constant.

All of the digital FSK demodulation circuit 3026, digital PLL circuit 3030, switch 3032 and digital spindle servo circuit 3034 perform digital processing and are formed to be an integrated circuit on a semiconductor chip 3036.

To the digital FSK demodulation circuit 3026, the WBL signal, which is obtained from converting the signal through the optical pickup 3024 into the two-level signal, is supplied. The WBL signal (FSK modulated signal) Vi(t) is expressed as follows:

$Vi(t)=A_0 \cos(\omega_c t+\Delta\Omega\int Vs(t)dt+\phi)$, where $\omega_c$ represents a carrier frequency, $\Delta\Omega$ represents a modulation depth, Vs(t) represents a modulation signal and $\phi$ represents an initial value.

An instantaneous phase angle $\phi(t)$ is expressed as follows:

$\phi(t)=\omega_c t+\Delta\Omega\int Vs(t)dt+\phi$.

The FSK demodulation is to obtain the modulation signal Vs(t) from the instantaneous phase angle $\phi(t)$. The time $t_n$ which fulfills $\phi(t)=(2n-1)\pi/2$ is equivalent to the phase angle when Vi(t)=0. It is easy to detect Vi(t)=0 through a digital circuit. Then, the phase $\phi(n)$ at the time t is obtained, and a differential value $x(n)=\phi(n)-\phi(n-1)$ is obtained. Thereby, an angular frequency can be obtained.

A Z-transform is performed on the function x(n) and $X(z)=\Phi(z)(1-z^{-1})$ is obtained. In this operation, X(z) is a differential of $\Phi(z)$. Therefore, an angular frequency is obtained. Thus, Vs(t) is obtained from the equation $d\phi(t)/dt=\omega_c+\Delta\Omega Vs(t)$. Practically, if it is assumed that the frequency of clock pulses with which a phase angle $\phi(n)$ is counted is sufficiently high and error from sampling error can be substantially removed, FSK demodulation can be performed.

Figure 16:
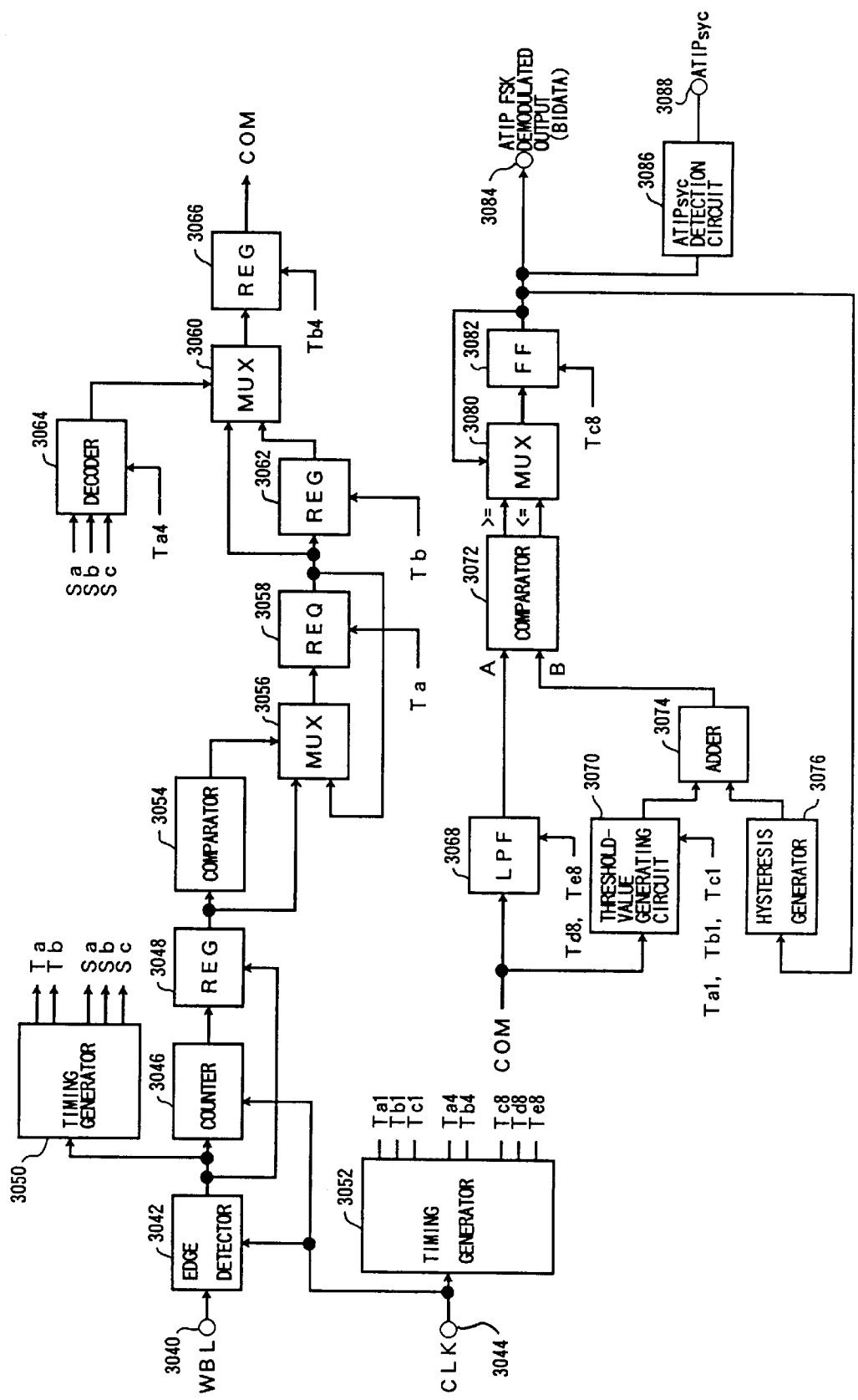
FIG. 16 shows a block diagram of an example of a digital FSK demodulation circuit of the optical disk device shown in FIG. 15.

FIG. 16 shows a block diagram of an example of the digital FSK demodulation circuit 3026. In the figure, the WBL signal such as that shown in FIG. 7C is input to a terminal 3040, and is supplied to an edge detector 3042. The frequency of the WBL signal is 22.05±1 kHz when the operation speed is the single speed, is 44.1±2 kHz when the operation speed is the double speed and is 88.2±4 kHz when the operation speed is the four-times speed. Further, the frequency of system clock pulses CLK input to a terminal 3044 is 8.64 MHz when the operation speed is the single speed, is 17.29 MHz when the operation speed is the double speed and is 34.57 MHz when the operation speed is the four-times speed.

The edge detector 3042 detects each rising edge of the WBL signal by using the system clock pulses CLK, and supplies a rising edge detection signal to a counter 3046, a register 3048 and a timing generator 3050. The counter 3046 is reset to have the count value of 0, and then, counts the system clock pulses CLK. The counter 3046 supplies the count value to the register 3048. The register stores the count value when the rising edge detection signal is input. Thus, the register stores the count value representing the period of the WBL signal, that is, the value of $x(n)=\phi(n)-\phi(n-1)$.

The timing generator 3050 generates phase-different timing signals Ta, Tb and timing signals Sa, Sb and Sc in synchronization with the rising edge detection signal of the WBL signal. A timing generator 3052 generates timing signals Ta$_1$, Tb$_1$, Tc$_1$, Ta$_4$, Tb$_4$, Tc$_8$, Td$_8$, Te$_8$. The subscripts 'a', 'b', 'c', 'd' represent output timing. 'a' represents the earliest timing and 'e' represents the latest timing. The subscript '1' represents the frequency 22.05 kHz when the operation speed is the single speed, the subscript '4' represents the frequency of 88.2 kHz when the operation speed is the single speed, the subscript '8' represents the frequency of 176.4 kHz when the operation speed is the single speed. When the operation speed is the double speed or the four-times speed, these frequencies are doubled or quadrupled according to the frequency of the system clock pulses.

The count value stored in the register 3048 is 196±α (where α is on the order of tens) in the ordinary operation. This count value is supplied to a comparator 3054 and a multiplexer (MUX) 3056. The comparator 3054 outputs a low-level selection signal when the count value of the register 3048 is, for example, within the range of the order of from 100 to 300. The comparator 3054 outputs a high-level selection signal when the count value of the register 3048 is out of the range. The generated selection signal is supplied to the multiplexer 3056. To the multiplexer 3056, the preceding-time count value, output by a register 3058, is also supplied. When the comparator outputs the low-level selection signal, that is, the count value of the register 3048 is within the range of the ordinary operation, the multiplexer 3056 selects and outputs the output value (the value obtained at this time) of the register 3048. When the comparator outputs the high-level selection signal, that is, the count value of the register 3048 is out of the range of the ordinary operation, the multiplexer 3056 selects and outputs the output value (the value obtained at the preceding time) of the register 3058.

The output value of the multiplexer 3056 is supplied to the register 3058. The output of the register 3058 is supplied to a multiplexer 3060 directly and also is supplied the multiplexer 3060 via a register 3062. The registers 3058 and 3062 perform storing operations with the different timing signals Ta and Tb, respectively.

At the time the timing signal $Ta_4$ is supplied, a decoder 3064 decodes the values of the timing signals Sa, Sb and Sc, and determines whether the multiplexer 3060 is caused to select the output value of the register 3058 or the output value of the register 3062. The value of the multiplexer 3060 output therefrom according to the determination is stored in a register 3066 in the timing of inputting of the timing signal $Tb_4$. The stored value is supplied to a digital low-pass filter (LPF) 3068 and a threshold-value generating circuit 3070. The registers 3058, 3062, multiplexer 3060 and decoder 3064 perform timing conversion from the timing in synchronization with the WBL signal to the timing in synchronization with the system clock pulses CLK.

The digital low-pass filter 3068 removes sudden change components of the supplied count value, and supplies the resulting value to a comparator 3072. The threshold-value generating circuit 3070 averages, for example, preceding tens to a hundred and tens of count values, and generates a threshold value which is supplied to an adder 3074. When the optical disk rotates at a predetermined line velocity, the threshold value is a value near 196. A hysteresis generator 3076 generates the value of $-\beta$, assuming that the BIDATA signal subsequently comes to be at the low level, when the FSK demodulated output, the BIDATA signal, is at the high level. The hysteresis generator 3076 generates the value of $+\beta$, assuming that the BIDATA signal subsequently comes to be at the high level, when the BIDATA signal is at the low level. $\beta$ is a value on the order of a value less than 10.

The adder 3074 sets the hysteresis to the above-mentioned threshold value, and supplies the resulting value to the comparator 3072 as a comparison reference value. The comparator 3072 compares the output of the digital low-pass filter 3068 with the comparison reference value. Then, a first comparison result of whether or not the former is equal to or more than the latter (when the former is equal to or more than the latter, a high level is output) and a second comparison result of whether or not the former is equal to or less than the latter (when the former is equal to or less than the latter, a low level is output) are supplied to a multiplexer 3080. A reason why the count value output from the digital low-pass filter 3068 is compared with the threshold value which is obtained from averaging is to remove the direct-current component due to $\omega_c$ and the direct-current component due to noise. A reason why the hysteresis is set is to improve the noise-resistant feature.

The multiplexer 3080 selects the comparison result, output by the comparator 3072, of whether or not the count value is equal to or less than the threshold value, when the FSK demodulated output, the BIDATA signal, is at the high level. The multiplexer 3080 selects the comparison result, output by the comparator 3072, of whether or not the count value is equal to or more than the threshold value when the BIDATA signal is at the low level. The selected comparison result is supplied to a D flip-flop 3082. The D flip-flop 3082 holds the supplied comparison result with the timing signal $Tc_8$, and outputs it via a terminal 3084 as the FSK demodulated output, the BIDATA signal.

Further, an $ATIP_{syc}$ detection circuit 3086 is connected to the D flip-flop 3082. The $ATIP_{syc}$ detection circuit 3086 detects the synchronization signal $ATIP_{syc}$ from the BIDATA signal, and outputs the synchronization signal $ATIP_{syc}$ via a terminal 3088.

With regard to the digital PLL circuit 3030 in the optical disk device shown in FIG. 15, the above-described digital PLL circuit in the third embodiment (shown in FIG. 14) is used as the digital PLL circuit 3030.

With regard to the digital spindle servo circuit 3034, the above-described spindle servo circuit in the first embodiment (shown in FIG. 8) is formed of a digital circuit and is used as the digital spindle servo circuit 3034. However, in the spindle servo circuit of FIG. 8, the addition circuit 64 is an analog circuit. Therefore, this circuit is an externally connected circuit of the semiconductor chip 3036.

Thus, except that the above-mentioned addition circuit of the spindle servo circuit is the externally connected circuit, each of the digital FSK demodulation circuit 3026, digital PLL circuit 3030 and digital spindle servo circuit 3034 is a digital circuit and therefore no externally connected circuit is necessary. Thus, it is easy to form the device into a semiconductor integrated circuit. Further, when the operation speed is changed from the single speed, to the double speed, and to the four-times speed, it is only necessary to change the frequency of the system clock pulses from the single-speed frequency to double the single-speed frequency and to four times the single-speed frequency. Change of the circuit properties and so forth are not necessary. Thus, it is easy to adapt the device for the different operation speeds.

Further, the present invention is not limited to the above-described embodiments, and variations and modifications may be made without departing from the scope of the present invention claimed in the following claims.

What is claimed is:

1. An optical disk device comprising:
   a digital demodulation circuit for receiving a signal which is obtained as a result of reproducing from an optical disk and converting into a two-level signal, on which optical disk a digital modulated signal was previously recorded, said digital demodulation circuit performing digital demodulation on the received signal;
   a digital Phase-locked loop circuit for generating a clock signal which is in phase synchronization with a demodulated signal output by said digital demodulation circuit; and
   a digital servo circuit for performing rotation control of said optical disk so as to correct a frequency error and a phase error between said clock signal and a reference clock signal;
   wherein said digital servo circuit comprises:
      speed error detecting means for detecting a speed error which is a frequency difference between a reproduced clock signal which is reproduced from the optical disk and a reference clock signal;
      first phase error detecting means for detecting a phase error which is a phase difference between the reproduced clock signal and the reference clock signal;
      servo signal generating means for generating a servo signal which is used for eliminating the speed error and phase error;
      second phase error detecting means for detecting a phase error which is a phase difference between a reproduced synchronization signal reproduced from the optical disk separately from the reproduced clock signal and a reference synchronization signal; and
      reference phase changing means for changing the phase of the reference clock signal based on the phase error detected by said second phase error detecting means.

2. The optical disk device according to claim 1, wherein said digital demodulation circuit, said digital phase-locked loop circuit and said digital servo circuit are formed to be an integrated circuit on a single semiconductor chip.

3. The optical disk device according to claim 1, wherein said digital demodulation circuit measures edge spans of the received two-level signal using system clock pulses, the frequency of which is changed according to an operation speed, and outputs a demodulated signal based on measured values.

4. The optical disk device according to claim 1 wherein said digital phase-locked loop circuit comprises:

measuring means for receiving an input signal which intermittently includes pulses of a predetermined pulse width and for measuring edge spans of the input signal; and clock signal generating means which, when an edge span value obtained by said measuring means is in a predetermined range which is based on said predetermined pulse width, generates said clock signal based on said edge span value.

5. The optical disk device according to claim 4 wherein said phase-locked loop circuit further comprising phase correcting means for detecting a phase error from a measurement value of said measuring means, said measurement value being obtained in timing of the clock signal which is generated by said clock signal generating means, said phase correcting means operating so that the edge span value measured by said measuring means is corrected.

6. The optical disk drive according to claim 1 wherein said digital servo circuit further comprises reference frequency changing means for changing the frequency of the reference clock signal based on the phase error detected by said second phase error detecting means.

7. An optical disk device comprising:

a digital demodulation circuit for receiving a signal which is obtained as a result of reproducing from an optical disk and converting into a two-level signal, on which optical disk a digital modulated signal was previously recorded, said digital demodulation circuit performing digital demodulation on the received signal;

a digital phase-locked loop circuit for generating a clock signal which is in phase synchronization with a demodulated signal output by said digital demodulation circuit; and a digital servo circuit for performing rotation control of said optical disk so as to correct a frequency error and a phase error between said clock signal and a reference clock signal;

wherein said digital servo circuit comprises:

speed error detecting means for detecting a speed error which is a frequency difference between a reproduced clock signal which is reproduced from the optical disk and a reference clock signal;

phase error detecting means for detecting a phase error which is a phase difference between the reproduced clock signal and the reference clock signal; and servo signal generating means for generating a servo signal which is used for eliminating the speed error and phase error, wherein said phase error detecting means comprises:

first and second frequency dividing means for performing frequency dividing on the reproduced clock signal and the reference clock signal, respectively, a frequency dividing ratio being changed according to a change of a speed error gain of said speed error detecting means; and phase comparing means for detecting a phase error between the frequency-divided reproduced clock signal and the frequency-divided reference clock signal.

8. The optical disk device according to claim 7, wherein said digital demodulation circuit, said digital phase-locked loop circuit and said digital servo circuit are formed to be an integrated circuit on a single semiconductor chip.

9. The optical disk device according to claim 7, wherein said digital demodulation circuit measures edge spans of the received two-level signal using system clock pulses, the frequency of which is changed according to an operation speed, and outputs a demodulated signal based on measured values.

10. The optical disk device according to claim 7 wherein said digital phase-locked loop circuit comprises:

measuring means for receiving an input signal which intermittently includes pulses of a predetermined pulse width and for measuring edge spans of the input signal; and clock signal generating means which, when an edge span value obtained by said measuring means is a predetermined range which is based on said predetermined pulse width, generates said clock signal based on said edge span value.

11. The optical disk device according to claim 10 wherein said phase-locked loop circuit further comprising phase correcting means for detecting a phase error from a measurement value of said measuring means, said measurement value being obtained in timing of the clock signal which is generated by said clock signal generating means, said phase correcting means operating so that the edge span value measured by said measuring means is corrected.

* * * * *